(12) United States Patent
Matsui

(10) Patent No.: US 10,063,032 B2
(45) Date of Patent: Aug. 28, 2018

(54) DISTRIBUTED REFLECTOR LASER

(71) Applicant: FINISAR CORPORATION, Sunnyvale, CA (US)

(72) Inventor: Yasuhiro Matsui, Milpitas, CA (US)

(73) Assignee: FINISAR CORPORATION, Sunnyvale, CA (US)

(*) Notice: Subject to any disclaimer, the term of this patent is extended or adjusted under 35 U.S.C. 154(b) by 0 days.

(21) Appl. No.: 15/451,376

(22) Filed: Mar. 6, 2017

(65) Prior Publication Data

US 2017/0256912 A1 Sep. 7, 2017

Related U.S. Application Data

(60) Provisional application No. 62/304,319, filed on Mar. 6, 2016, provisional application No. 62/339,575, filed on May 20, 2016.

(51) Int. Cl.
*H01S 5/00* (2006.01)
*H01S 3/08* (2006.01)
(Continued)

(52) U.S. Cl.
CPC .......... *H01S 5/1215* (2013.01); *H01S 3/0635* (2013.01); *H01S 5/0287* (2013.01);
(Continued)

(58) Field of Classification Search
CPC ........ H01S 5/1215; H01S 3/0635; H01S 5/12; H01S 5/06258; H01S 5/06256;
(Continued)

(56) References Cited

U.S. PATENT DOCUMENTS

| 4,908,833 A | * | 3/1990 | Chraplyvy | ............ | H01S 5/0622 372/28 |
| 2005/0238079 A1 | * | 10/2005 | Botez | ..................... | B82Y 20/00 372/96 |

(Continued)

OTHER PUBLICATIONS

International Search Report and Written Opinion for International Application No. PCT/US2017/021014, dated May 12, 2017, 15 pgs.

(Continued)

*Primary Examiner* — Yuanda Zhang
(74) *Attorney, Agent, or Firm* — Maschoff Brennan

(57) ABSTRACT

A distributed reflector (DR) laser may include a distributed feedback (DFB) region and a distributed Bragg reflector (DBR). The DFB region may have a length in a range from 30 micrometers (μm) to 100 μm and may include a DFB grating with a first kappa in a range from 100 cm$^{-1}$ to 150 cm$^{-1}$. The DBR region may be coupled end to end with the DFB region and may have a length in a range from 30-300 μm. The DBR region may include a DBR grating with a second kappa in a range from 150 cm$^{-1}$ to 200 cm$^{-1}$. The DR laser may additionally include a lasing mode and a p-p resonance frequency. The lasing mode may be at a long wavelength side of a peak of a DBR reflection profile of the DBR region. The p-p resonance frequency may be less than or equal to 70 GHz.

19 Claims, 23 Drawing Sheets

(51) Int. Cl.
*H01S 5/12* (2006.01)
*H01S 3/063* (2006.01)
*H01S 5/028* (2006.01)
*H01S 5/125* (2006.01)
*H01S 5/14* (2006.01)
*H01S 5/343* (2006.01)
*H01S 5/0625* (2006.01)

(52) U.S. Cl.
CPC ...... *H01S 5/06256* (2013.01); *H01S 5/06258* (2013.01); *H01S 5/12* (2013.01); *H01S 5/125* (2013.01); *H01S 5/1221* (2013.01); *H01S 5/141* (2013.01); *H01S 5/3432* (2013.01)

(58) Field of Classification Search
CPC ...... H01S 5/3432; H01S 5/141; H01S 5/1221; H01S 5/0287; H01S 5/125
See application file for complete search history.

(56) References Cited

U.S. PATENT DOCUMENTS

| | | | | |
|---|---|---|---|---|
| 2010/0265980 A1* | 10/2010 | Matsuda | ............... | B82Y 20/00 372/46.01 |
| 2010/0272133 A1* | 10/2010 | Kato | ................... | H01S 5/06256 372/20 |
| 2011/0299561 A1* | 12/2011 | Akiyama | ............ | H01S 5/02248 372/50.11 |
| 2013/0308178 A1* | 11/2013 | Matsui | ..................... | H01S 5/34 359/344 |
| 2014/0269807 A1 | 9/2014 | Matsui | | |
| 2016/0064897 A1* | 3/2016 | Higa | .................. | H01S 5/06256 372/50.11 |
| 2016/0164257 A1* | 6/2016 | Adachi | ................ | H01S 5/1231 385/14 |

OTHER PUBLICATIONS

Dumitrescu, M., et al., "Distributed Feedback Lasers with Photon-Photon-Resonance-Enhanced Modulation Bandwidth," Semiconductor Conference, 2012, International IEEE, Oct. 15, 2012, 4 pgs.
Radziunas, Mindaugas, et al., "Improving the Modulation Bandwidth in Semiconductor Lasers by passive Feedback," IEEE Journal of Selectred Topics in Quantum Electronics, IEEE Service Center, vol. 13, No. 1, Jan. 1, 2007, 8 pgs.

* cited by examiner

- DBR Laser Design
  - AlGaInAs QW Active, $N_w$ = 12
  - SGO = +2.2nm At RT
  - $\kappa$ = 210cm$^{-1}$ (Large)
    - Grating Below Active, QWS
  - SI-BH, W^Active = 1.4 um
  - DBR With Butt-Joint
    - $L_{act}$ = 100um
    - $L_{F.DBR}$ = 50 um, $L_{R.DBR}$ = 100um
  - AR/AR Coating
  - Single Mode Yield Is "Near 100%"
- Performance

| Parameter | 25C | 85C |
|---|---|---|
| Ith (mA) | 3.6 | 11 |
| SE (W/A) | 0.30 | 0.15 |
| SMSR (dB) | 40 | 40 |
| ME0 (GHz/mA$^{1/2}$) | 3.8 | 3.0 |
| fr @ ith+36 (GHz) | 23 | 17.3 (Ith+49) |
| f3dB (Ghz) | 28 (80mA) | 21 (80mA) |
| DER (dB) | 5 | 5 |

*FIG. 20A*

DISTRIBUTED REFLECTOR LASER

CROSS-REFERENCE TO RELATED APPLICATIONS

This application claims the benefit of and priority to U.S. Provisional App. No. 62/304,319 filed Mar. 6, 2016, and to U.S. Provisional App. No. 62/339,575 filed May 20, 2016. The foregoing provisional applications are incorporated herein by reference.

FIELD

The embodiments discussed herein are related to distributed reflector (DR) lasers.

BACKGROUND

Lasers have become useful in a number of applications. For example, lasers may be used in optical communications to transmit digital data across a fiber optic network. The laser may be modulated by a modulation signal, such as an electronic digital signal, to produce an optical signal transmitted on a fiber optic cable. An optically sensitive device, such as a photodiode, is used to convert the optical signal to an electronic digital signal transmitted through the fiber optic network. Such fiber optic networks enable modern computing devices to communicate at high speeds and over long distances.

One component included in many optical transmitters is a distributed Bragg reflector ("DBR" or "DBR mirror"). A DBR is a reflector formed from multiple layers of alternating materials with varying refractive index, or by periodic variation of some characteristic (such as height) of a dielectric waveguide, resulting in periodic variation in the effective refractive index through the DBR. Each layer boundary may cause a partial reflection of an optical wave. DBRs may be included in some edge-emitting lasers, such as DBR lasers.

In various industries, bitrates for data transmission per channel have surpassed 100 gigabit per second (Gb/s), establishing transmitter performance exceeding 60 gigahertz (GHz) bandwidth (BW) as an industry goal for the 100 Gb/s non-return-to zero (NRZ) format. Although some electro absorption modulators have exhibited the capability to approach 60 GHz BW, the BW of Mach-Zehnder modulators and directly modulated lasers (DML) have lagged behind at approximately 30 GHz.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

Some example embodiments discussed herein generally relate to DR lasers.

In an example embodiment, a DR laser may include a distributed feedback (DFB) region and a DBR. The DFB region may have a length in a range from 30 micrometers (µm) to 100 µm and may include a DFB grating with a first kappa in a range from 100 cm$^{-1}$ to 180 cm$^{-1}$. The DBR region may be coupled end to end with the DFB region and may have a length in a range from 30-300 µm. The DBR region may include a DBR grating with a second kappa in a range from 100 cm$^{-1}$ to 200 cm$^{-1}$. The DR laser may additionally include a lasing mode and a p-p resonance frequency. The lasing mode may be at a long wavelength side of a peak of a DBR reflection profile of the DBR region. The p-p resonance frequency may be less than or equal to 70 GHz. For instance, for 100 Gb/s applications, Fr may be in a range from 30-35 GHz, and photon-photon resonance (PPR) frequency can be in a range from 50 GHz-60 GHz, and no more than 70 GHz. If Fr and PPR frequency are too close, S21 response cannot be flat. Thus, it may better to separate these two peaks by ~20 GHz. Moreover, if overall a 3 dB BW of ~40 GHz is achieved, this should be good for 50 Gbaud PAM4 modulation (e.g., 100 Gb data for one laser).

In another example embodiment, a DR laser may include a distributed feedback (DFB) region and a distributed Bragg reflector (DBR). The DFB region may have a length in a range from 30 micrometers (µm) to 100 µm and may include a DFB grating with a first kappa in a range from 100 cm$^{-1}$ to 180 cm$^{-1}$. The DBR region may be coupled end to end with the DFB region and may have a length in a range from 30-300 µm. The DBR region may include a DBR grating with a second kappa in a range from 100 cm$^{-1}$ to 200 cm$^{-1}$. The DR laser may additionally include a lasing mode and an external cavity mode formed by the DBR region. The lasing mode may be at a long wavelength side of a peak of a DBR reflection profile of the DBR region. The external cavity mode may be close to the lasing mode.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present disclosure, a more particular description of the disclosure will be rendered by reference to specific embodiments thereof which are illustrated in the appended drawings. It is appreciated that these drawings depict only typical embodiments of the disclosure and are therefore not to be considered limiting of its scope. The disclosure will be described and explained with additional specificity and detail through the use of the accompanying drawings in which:

FIGS. 20A and 20B disclose a different DR laser design than the DR laser of FIG. 1 or 2.

DETAILED DESCRIPTION OF SOME EXAMPLE EMBODIMENTS

Particular embodiments of the present disclosure will be described with reference to the accompanying drawings. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the figures, can be arranged, substituted, combined, separated, and designed in a wide variety of configurations, all of which are explicitly contemplated herein.

Embodiments of the present disclosure will now be explained with reference to the accompanying figures.

Figure 1:
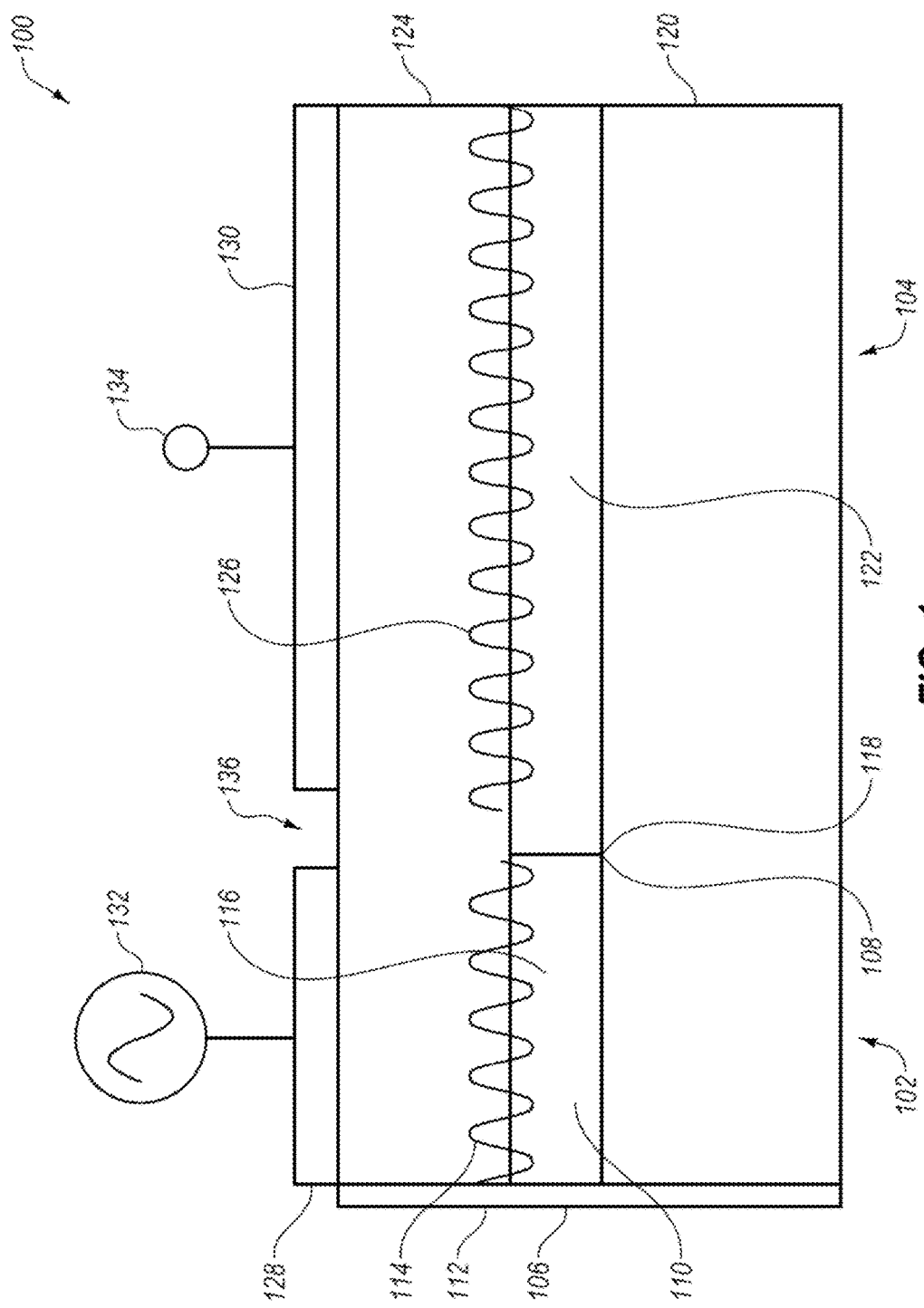
FIG. 1 illustrates an example DR laser.

FIG. 1 illustrates an example DR laser 100, arranged in accordance with at least one embodiment described herein. The DR laser 100 includes a DFB region 102 and a DBR region 104.

The DFB region 102 may extend from a backside 106 to a frontside 108. The DFB region 102 may include a gain section 110 that extends from the backside 106 to the frontside 108. A High Reflection (HR) coating 112 may be disposed and/or formed on the backside 106, in optical communication with the gain section 110.

The gain section 110 of the DFB region 102 may include a DFB grating 114 and a multiple quantum well region ("MQW region") 116. The DFB grating 114 may have a kappa of about 120 $cm^{-1}$, or higher or lower than 120 $cm^{-1}$. Generally, for instance, the DFB grating 114 may have a kappa in a range from 100 to 180 $cm^{-1}$. The MQW region 116 may include multiple quantum wells. In some embodiments, the quantum wells may be compressively-strained and formed from aluminum gallium indium arsenide (AlGaInAs) or other suitable materials. In these and other embodiments, the DFB region 102 may range in length from 30 micrometers (μm) to 100 μm and the gain section 110 may range in length correspondingly. For instance, the DFB region 102 and the gain section 110 may have a length of 50 μm in some embodiments.

The HR coating 112 may be formed from alternating layers of silicon (Si) and aluminum oxide (e.g., $Al_2O_3$) or other suitable materials. The HR coating 112 may have a reflectivity of approximately 93%, or higher or lower than 93%.

The DBR region 104 may extend from a backside 118 to a frontside 120 such that the frontside 108 of the DFB region 102 is in optical communication with the backside 118 of the DBR region 104. The DBR region 104 may include a passive grating section 122 that extends from the frontside 120 toward the backside 118 to optically communicate with the gain section 110 of the DFB region 102. An anti-reflective coating ("AR coating") 124 may be disposed and/or formed on the frontside 120, in optical communication with the passive grating section 122.

The passive grating section 122 may include a DBR grating 126. The DBR grating 126 may have a kappa of about 180 $cm^{-1}$, or higher or lower than 180 $cm^{-1}$. Generally, for instance, the DBR grating 126 may have a kappa in a range from 100 to 200 $cm^{-1}$. In some embodiments, the passive grating section 122 may be formed from InGaAsP for a bandgap wavelength of 1.1 μm-1.3 μm for lasing operation at 1300 nanometers (nm). In these and other embodiments, the DBR region 104 may range in length from 30 μm to 300 μm and the passive grating section 122 may range in length correspondingly. For instance, the DBR region 104 and the passive grating section 122 may have a length of 200 μm in some embodiments.

The AR coating 124 may be formed from $Al_2O_3$ and titanium dioxide ($TiO_2$), such as a double-layer $Al_2O_3/TiO_2$ AR coating, or other suitable layers and/or materials. The AR coating 124 may have a reflectivity of approximately 1%, or a reflectivity of more or less than 1%.

In an example embodiment, the DFB region 102 may be 50-100 μm in length and the DBR region 104 may be 200 μm in length, or more generally 150-250 μm in length. The DFB region 102 and the DBR region 104 may be integrated by a butt-joint process. The DFB grating 114 may extend to a length of approximately 50-100 μm. As already mentioned, the DFB grating 114 may have a grating strength kappa of approximately 120 $cm^{-1}$ and the DBR grating 126 may have a grating strength kappa of approximately 180 $cm^{-1}$. PN blocking layers may be grown for the buried-hetero structure and the parasitic capacitance in the blocking layer may be reduced by forming double channels (e.g., a double channel stripe), and using BCB under the contact pad. The estimated parasitic capacitance may be 0.37 picofarads (pF), providing an RC 3-dB cutoff frequency of 22 GHz for the measure resistance of 20 ohms. In order to lower the parasitic capacitance, Fe-doped InP may be used for the current blocking region in the DR laser 100.

Each of the DFB region 102 and the DBR region 104 has a respective contact 128 or 130 through which a modulation signal 132 and/or bias 134 may be provided, as illustrated. A gap 136 is provided between the contact 128 of the DFB region 102 and the contact 130 of the DBR region 104, referred to as a contact gap 136. The contact gap 136 may be about 10 μm between the two contacts 128 and 130, or more or less than 10 μm.

Figure 2:
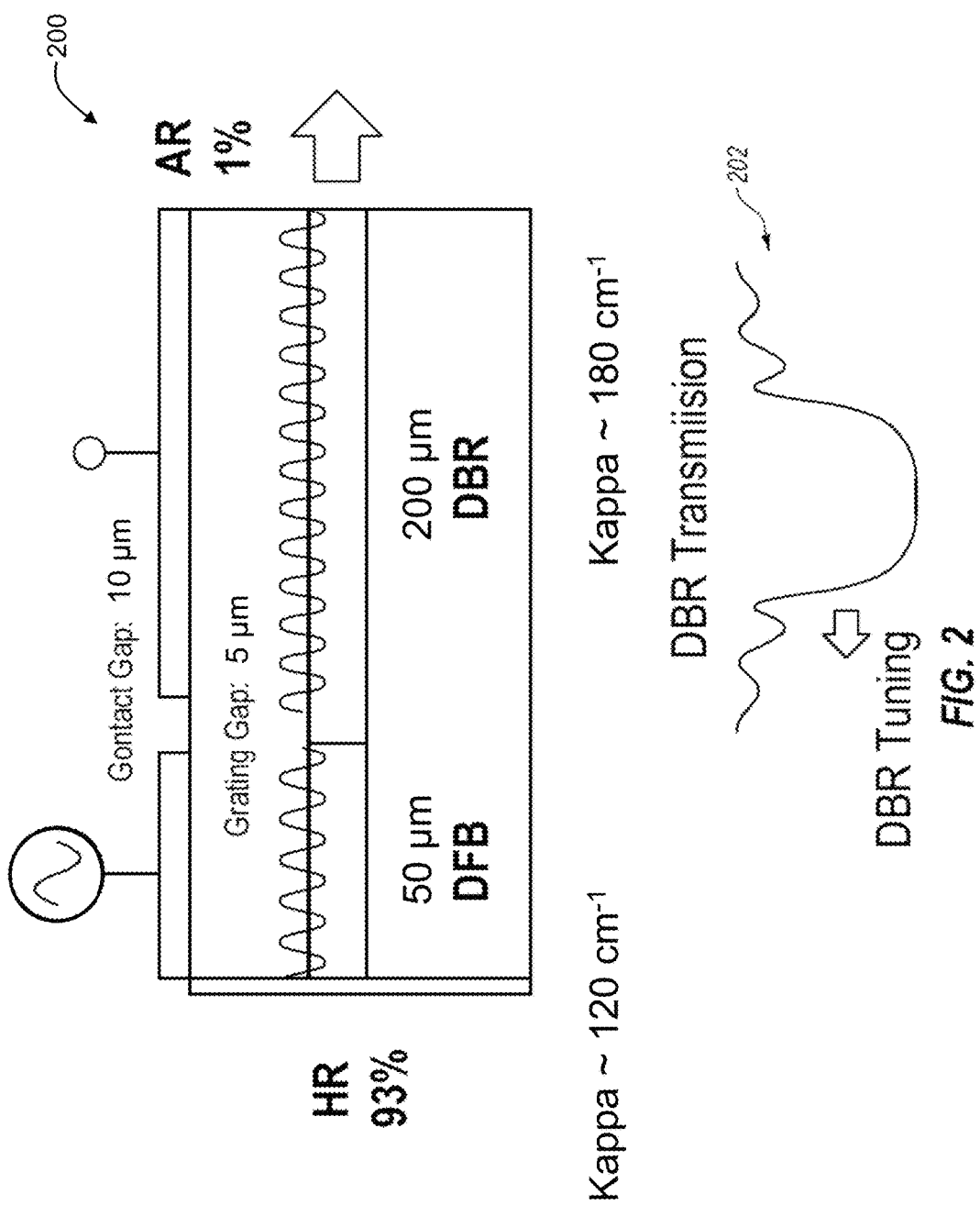
FIG. 2 illustrates a particular embodiment of the DR laser of FIG. 1.

FIG. 2 illustrates a particular embodiment 200 of the DR laser 100 of FIG. 1 with some of the parameters described above, arranged in accordance with at least one embodiment described herein. FIG. 2 additionally includes an optical transmission spectrum 202 of the DBR region 104 according to at least one embodiment. The particular embodiment 200 illustrated in FIG. 2 of the DR laser 100 of FIG. 1 will be hereinafter referred to as DR laser 200.

As explained in further detail below, DR lasers according to some embodiments described herein may simultaneously exhibit a photon-photon (p-p) resonance (PPR) effect, a detuned-loading effect, and an in-cavity frequency module-to-amplitude modulation (FM-AM) conversion effect. At least one example embodiment of the DR lasers described herein may achieve a 3-dB BW of 55 GHz and 112 Gb/s PAM-4 modulation.

In more detail, the integrated external cavity formed by a passive waveguide (e.g., in the form of the DBR region 104) enables, during modulation, the excitation of an additional cavity mode located in the vicinity of the main DFB mode. This causes a resonant enhancement of the modulation sideband that is close to the adjacent cavity mode. The p-p resonance effect can be used to extend the modulation bandwidth beyond the bandwidth of the solitary DFB, which may be determined by the intrinsic resonant frequency (Fr).

The detuned-loading effect has been also known to enhance the modulation BW of DMLs. This effect has been reported for DBR lasers where the dispersive nature of a Bragg mirror dynamically changes the mirror loss and the penetration depth into the DBR section as the lasing frequency is modulated. When the lasing happens on the long-wavelength flank of the Bragg mirror, the laser chirp is translated into an effective enhancement of the differential gain, and thus improves the speed of the lasers.

Figure 3:
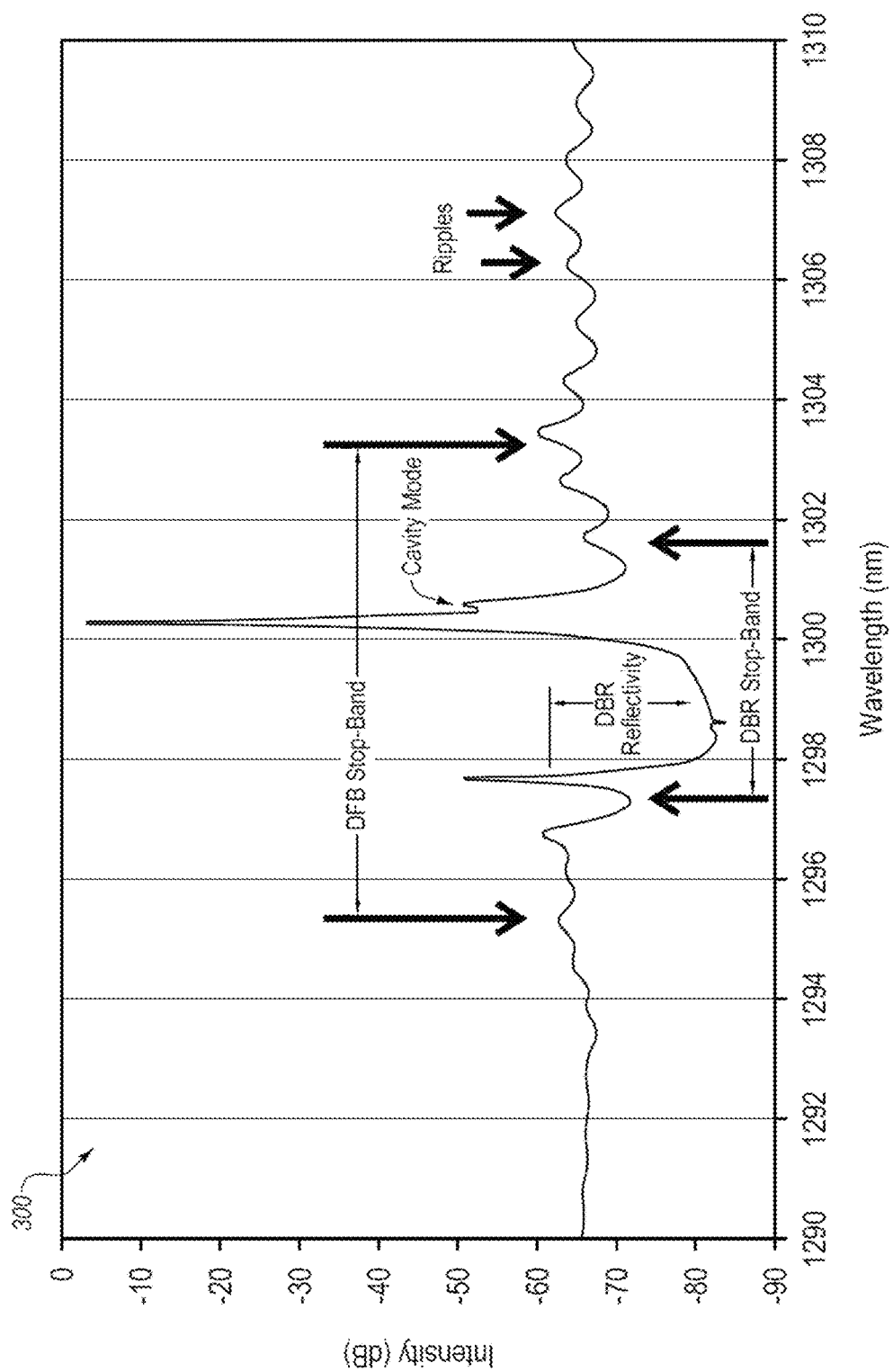
FIG. 3 illustrates an optical transmission spectrum of an example DR laser.

FIG. 3 illustrates an optical transmission spectrum 300 of an example DR laser, arranged in accordance with at least one embodiment described herein. For instance, the DR laser 100 of FIG. 1 and/or the DR laser 200 of FIG. 2 may have the optical transmission spectrum 300 of FIG. 3.

With combined reference to FIGS. 2 and 3, light may exit the DR laser 200 to the right, passing through the DBR region. The DBR region blocks the light at the center, referred to as the "DBR stop-band" in FIG. 3. The DBR stop-band width is roughly 5 nm in the optical transmission spectrum 300 of FIG. 3, and may be determined by the length of the DBR region or DBR grating and/or by the kappa of the DBR grating. In the optical transmission spectrum 300, this stop-band for the DBR region is clearly visible in FIG. 3. Also, smaller ripples in the background (denoted as "Ripples" in FIG. 3) may be determined by the length of the DBR region or DBR grating. The DFB region also has a grating, and the stop band for the DFB region is labeled "DFB stop-band" in FIG. 3. The DFB stop-band is much wider at roughly 8 nm due to short cavity length (50 μm in this example) and weaker kappa for the DFB region compared to the DBR region.

Figure 4:
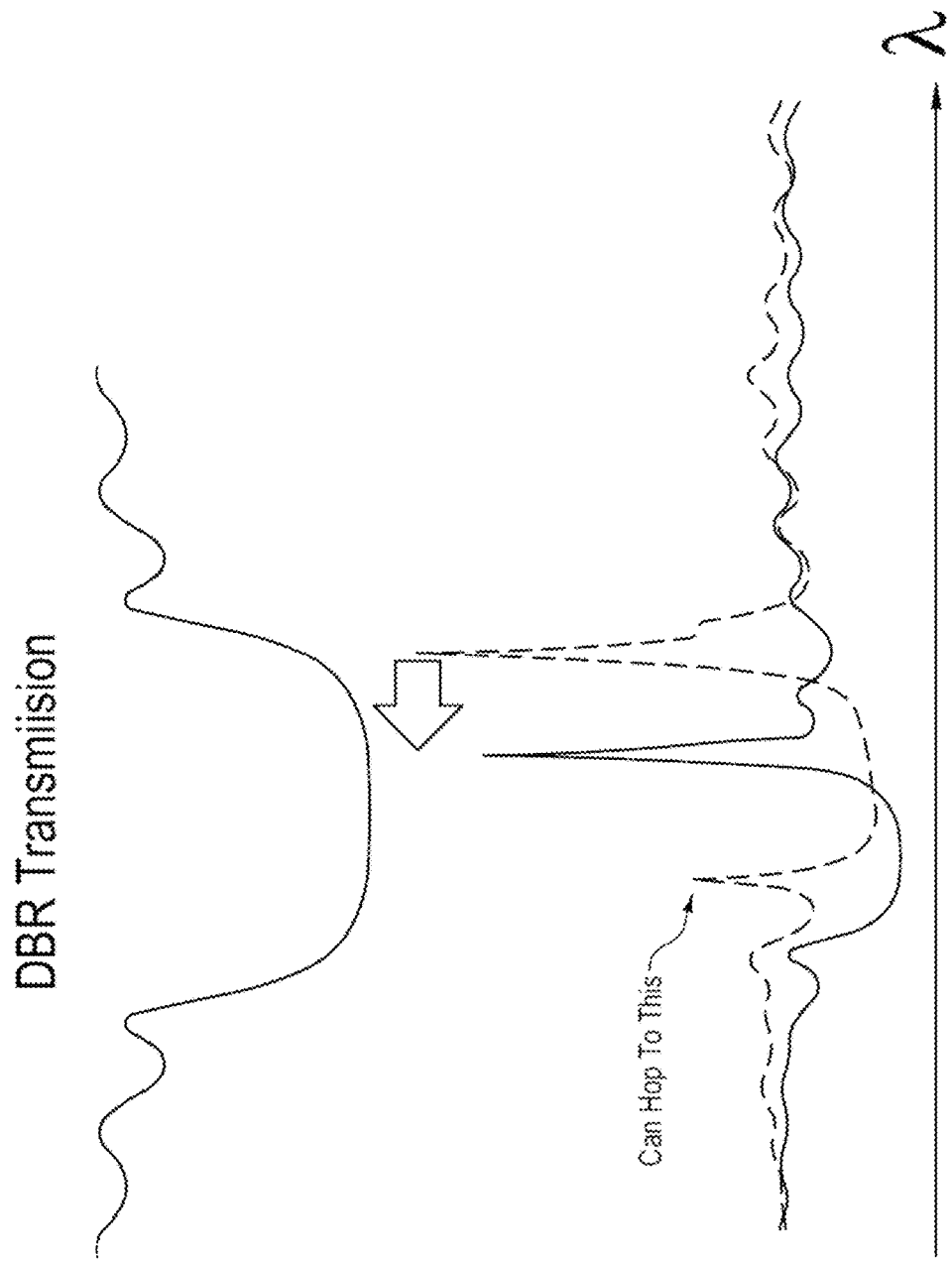
FIG. 4 illustrates example modulation spectra of a DFB region of a DR laser relative to a DBR transmission profile of a DBR region of the DR laser.

FIG. 4 illustrates example modulation spectra of the DFB region relative to a DBR transmission profile of the DBR region of the DR laser 100 or 200 of FIG. 1 or 2, arranged in accordance with at least some embodiments described herein. With reference to FIG. 4, and according to some embodiments, lasing of the DFB region occurs at a frequency (or wavelength) on the right edge of the DBR stop-band. Then, when the DR laser is modulated (e.g., through modulation of the DFB region), lasing frequency changes due to frequency chirp toward shorter wavelength as the modulation goes from the bias for the 0 bits to the bias for the 1 bits. Then, this reduces the transmission (or increases the reflection) of the laser cavity. In other words, the loss of the laser cavity is reduced dynamically. This can effectively enhance the differential gain, and increase the intrinsic speed of the DR laser. This effect is called "detuned-loading effect".

To maximize the detuned-loading effect, a relatively steep slope on the edge of the DBR region may be realized. Also, if the laser cavity length is long, the space between longitudinal modes gets smaller. In this case, as we tune the lasing wavelength on the edge of the DBR region, a mode hop can happen to the left side in FIG. 4 (or more generally toward the short wavelength side) if the laser cavity is relatively long. To avoid mode hop, it is better to use short-cavity laser and narrow DBR stop-band for DBR region as disclosed herein (e.g., as described with respect to FIG. 3).

Figure 5:
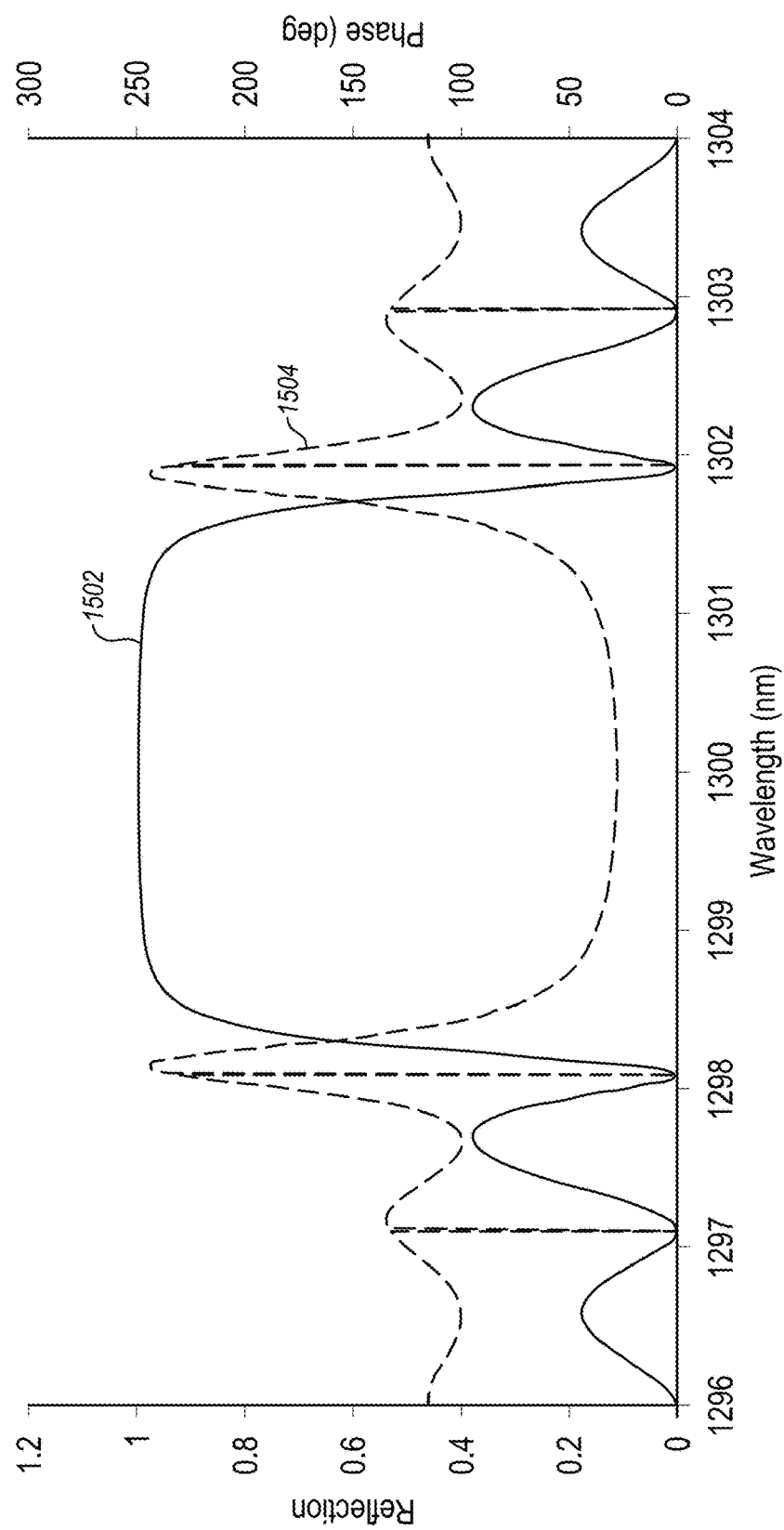
FIG. 5 illustrates reflection and phase of the DBR region of the DR laser of FIG. 2, each as a function of wavelength.

FIG. 5 illustrates reflection 1502 and phase 1504 of the DBR region of the DR laser 200 of FIG. 2, each as a function of wavelength, arranged in accordance with at least one embodiment described herein. The rapid change in phase around 1302 nm in the example of FIG. 5 means that the light can penetrate deep into the DBR region. So, it is possible to excite an "external cavity mode".

Figure 6:
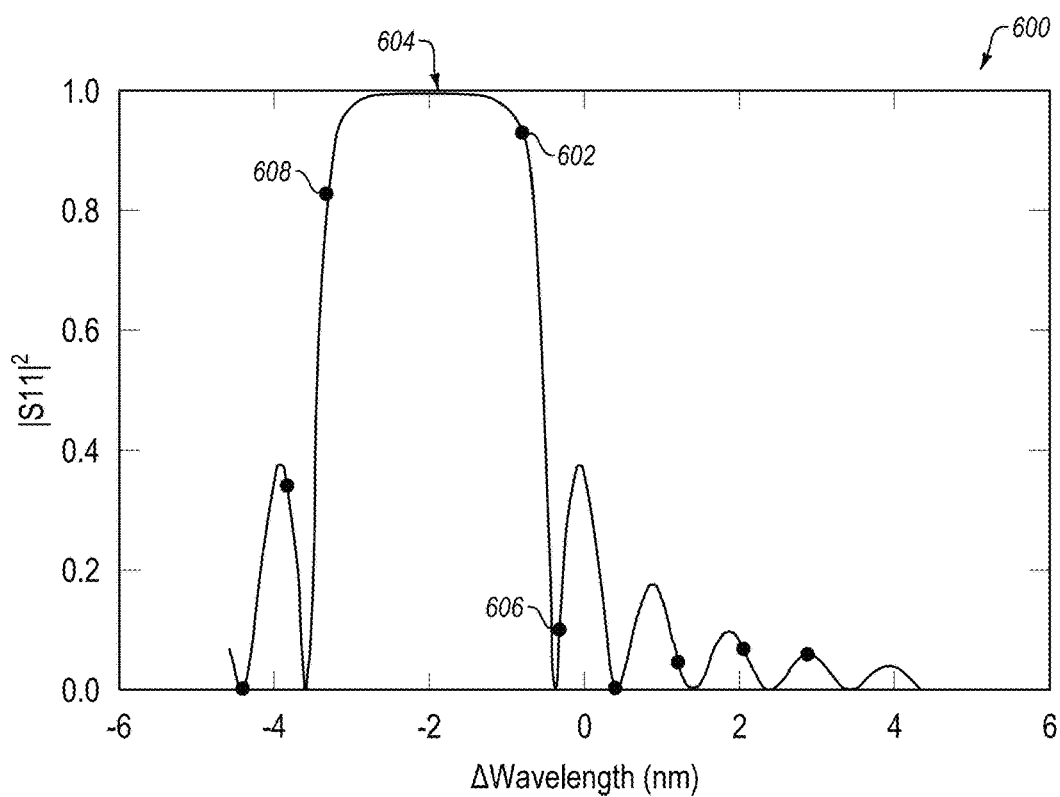
FIG. 6 illustrates a DBR reflection profile of a DR laser, such as the DR laser of FIG. 1 or 2.

This situation is explained with reference to FIG. 6, which illustrates a DBR reflection profile 600 of a DR laser, such as the DR laser 200 of FIG. 2, arranged in accordance with at least one embodiment described herein. A small dot labeled "602" in FIG. 6A (hereinafter "lasing mode 602") just right of a peak 604 of the DBR reflection profile 600 is at the lasing mode wavelength for a DFB region of the DR laser. And at the bottom of the DBR reflection profile 600, an "external cavity mode" is designated at 606.

As mentioned, the lasing mode 602 represents the lasing mode wavelength (or main mode) of the DFB region of the DR laser. The DBR reflection profile 600 additionally includes a dot labeled "608" (hereinafter "side mode 608") just left of the peak 604 at a side mode wavelength of the DFB region. The side mode 608 is another mode on the opposite side of the DBR peak 604 from the lasing mode 602. When the phase condition of lasing changes, for example, by injection of current into the gain section (e.g., gain section 110 of FIG. 1) of the DFB region, local heating happens to the gain section. The local heating changes the index of refraction of the gain section of the DFB region and shifts those mode positions (e.g., the lasing mode 602 and the side mode 608) toward longer wavelengths. As a result, the lasing mode 602 moves down on the increasingly steep longer wavelength slope (or edge) of the peak 604 of the DBR reflection profile 600, thereby experiencing decreased reflectivity from the DBR region. This increases the detuned-loading effect and enhances the speed of the DR laser. However, the side mode 608 moves up on the decreasingly steep shorter wavelength slope of the peak 604 of the DBR reflection profile 600, thereby experiencing increased and higher reflectivity from the DBR region than the lasing mode 602. As a result, the mode of the DFB region can hop from the lasing mode 602 to the side mode 608. Sometimes hysteresis is observed when photon density in the cavity is very high, but the foregoing is roughly true. So, the speed enhancement by detuned-loading effect is limited by the mode hop.

To avoid mode hop behavior, a DBR region with a relatively narrower peak in its DBR reflection profile may be used in the DR laser. Such a DBR region may result from forming the DBR region relatively longer in length with kL>2 where kappa is grating coupling coefficient and L is the length of the DBR region. A relatively shorter length for the DFB region may also help avoid mode hop behavior because the frequency spacing between the lasing mode 602 and the side mode 604 may increase with decreasing length of the DFB region, and can avoid mode hop. Use of a relatively stronger grating in the DFB region may also help to avoid mode hop by increasing the threshold gain difference between the main DFB mode (e.g., the lasing mode 602) and the DFB side mode (e.g., side mode 608).

Figure 7A:
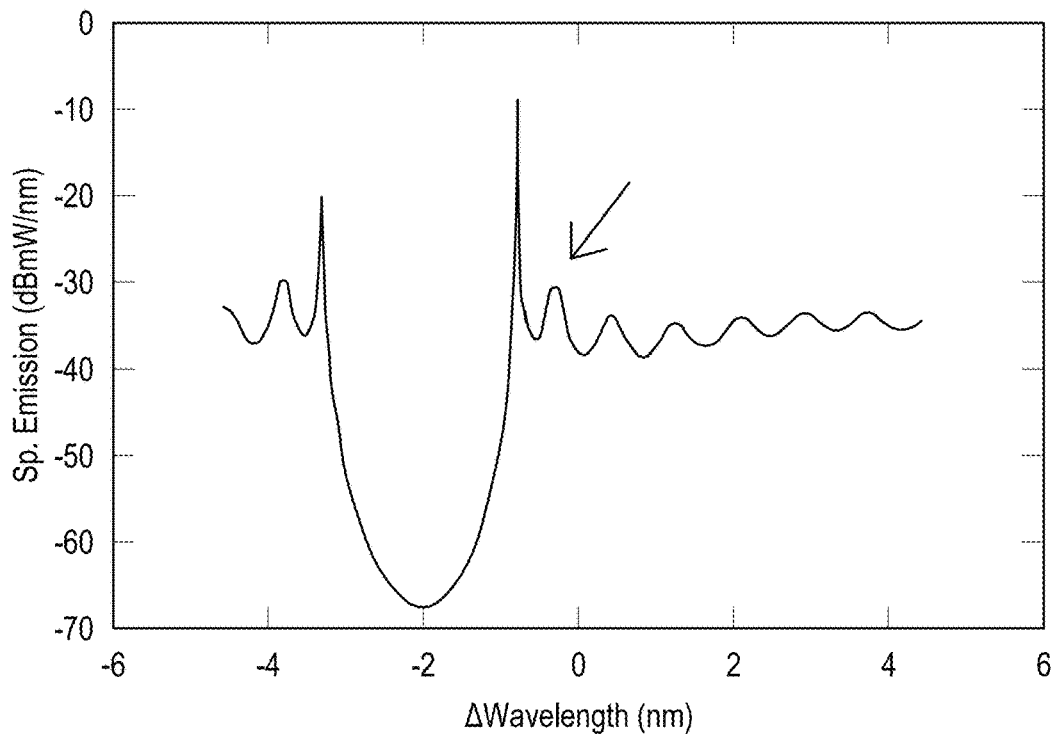
FIG. 7A illustrates a corresponding optical spectrum of a DR laser, such as the DR laser of FIG. 1 or 2.

Phase condition can be tuned also by current injection to the DBR section. In this case, the envelope of the DBR reflection profile may move toward the shorter wavelength. FIG. 7A illustrates a corresponding optical spectrum of a DR laser, such as the DR laser of FIG. 1 or 2. The presence of an external cavity mode can be seen in FIG. 7A.

Some embodiments described herein leverage p-p resonance in combination with detuned-loading to improve performance of the DR laser. In short, p-p resonance means there is an additional mode, e.g., the external cavity mode 606 of FIG. 6, near the main mode (or the lasing mode 602), and the external cavity mode can beat with the main mode, and help to modulate the light. As illustrated in FIG. 6, the external cavity mode 606 is near the null of Bragg reflection on the long wavelength side. As illustrated in FIG. 5, the phase 1504 of the DBR mirror changes rapidly around this null point (dip of reflection). At this wavelength, the wavelength of incident light does not match with the pitch of grating written on the waveguide of the DBR region. So, reflection does not happen efficiently, therefore reflection drops. That means that the light can penetrate deeper to the DBR region before it is eventually reflected. Thus, we can call it a "cavity mode" or "external cavity mode" that travels deeper into the DBR region.

Embodiments described herein may locate the external cavity mode 606 close to the main DFB mode (e.g., lasing mode 602) because the beat frequency of these modes can help the modulation response of the DR laser at around the corresponding frequency. To locate the external cavity mode 606 close to the lasing mode 602, the DBR reflection profile may have a very sharp drop of reflection near the edge. Such a sharp drop of reflection near the edge can be realized, again, by using longer DBR length and corresponding kappa to realize kL>2 (corresponding reflection ~>90%). Such a condition may also satisfy the condition for strong detuned-loading, so it is possible to achieve the two effects simultaneously.

Figure 7B:
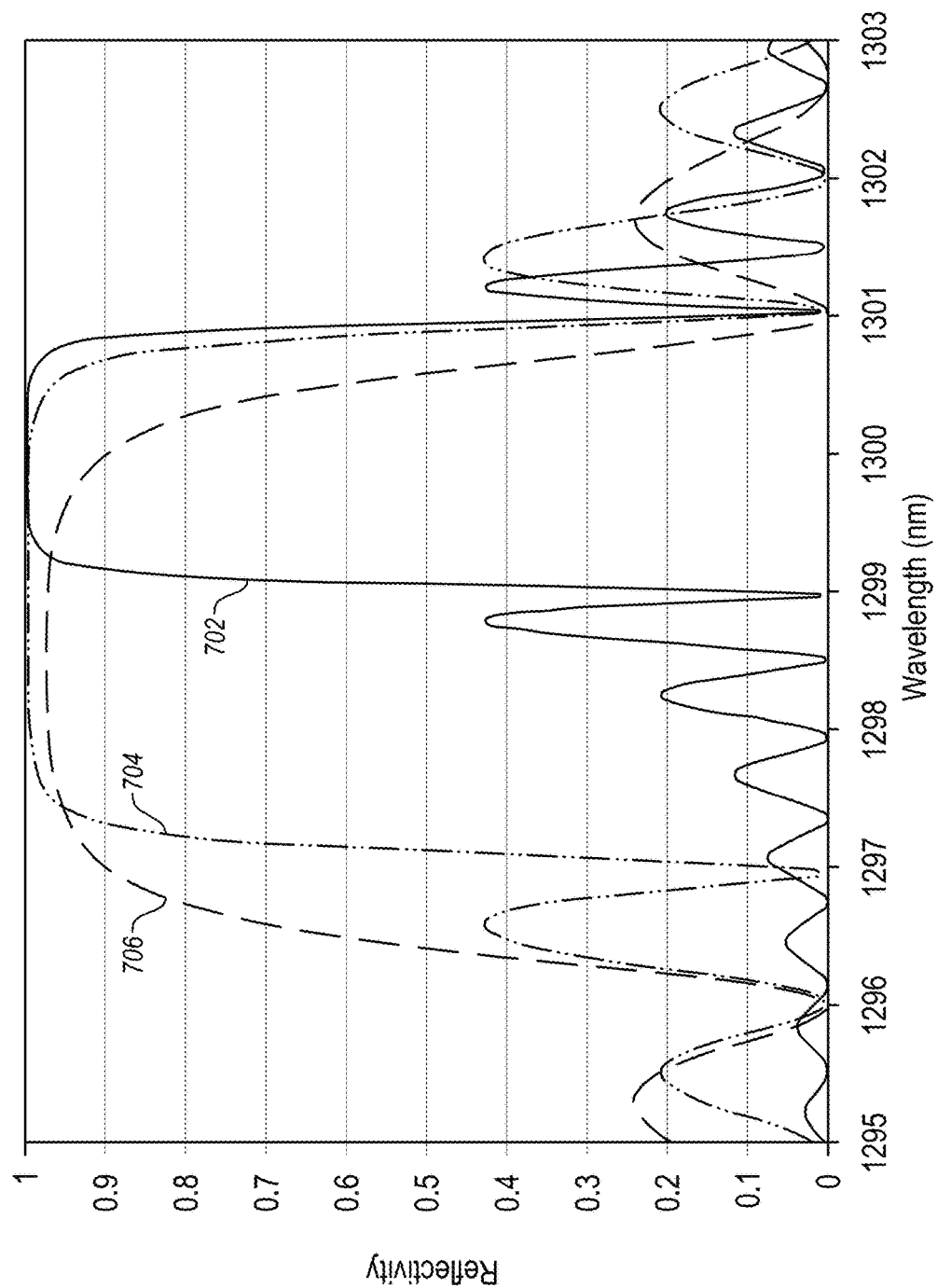
FIG. 7B shows an example of three different DBR mirror calculations represented by DBR reflection profiles.

FIG. 7B shows an example of three different DBR mirror calculations represented by DBR reflection profiles 702, 704, and 706, arranged in accordance with at least one embodiment described herein. By comparing the two cases for DBR reflection profile 702: L=400 µm, kappa=100 cm$^{-1}$ (kL=4), and DBR reflection profile 704: L=200 µm, kappa=200 cm$^{-1}$ (kL=4), it can be seen that sharper edge can be obtained for longer DBR length when kL is kept constant. Also, it can be seen that the width of stopband becomes narrower for the DBR reflection profile 702 for longer DBR length. By comparing the two cases for DBR reflection profile 704: L=200 µm, kappa=200 cm$^{-1}$ (kL=4), and DBR reflection profile 706: L=130 µm, kappa=200 cm$^{-1}$ (kL=2.6), it can be seen that sharper edge can be obtained for longer DBR length when kappa is kept constant. Therefore, it is preferred to use longer DBR length in order to reduce the stop band to avoid mode hop and therefore create a strong detuned-loading effect. At the same time, the frequency difference between the main lasing mode on the edge of Bragg mirror/DBR reflection profile and the first null point (1301 nm in this case) can be minimized to reduce the p-p resonance frequency to enhance S21 response.

Figure 8:
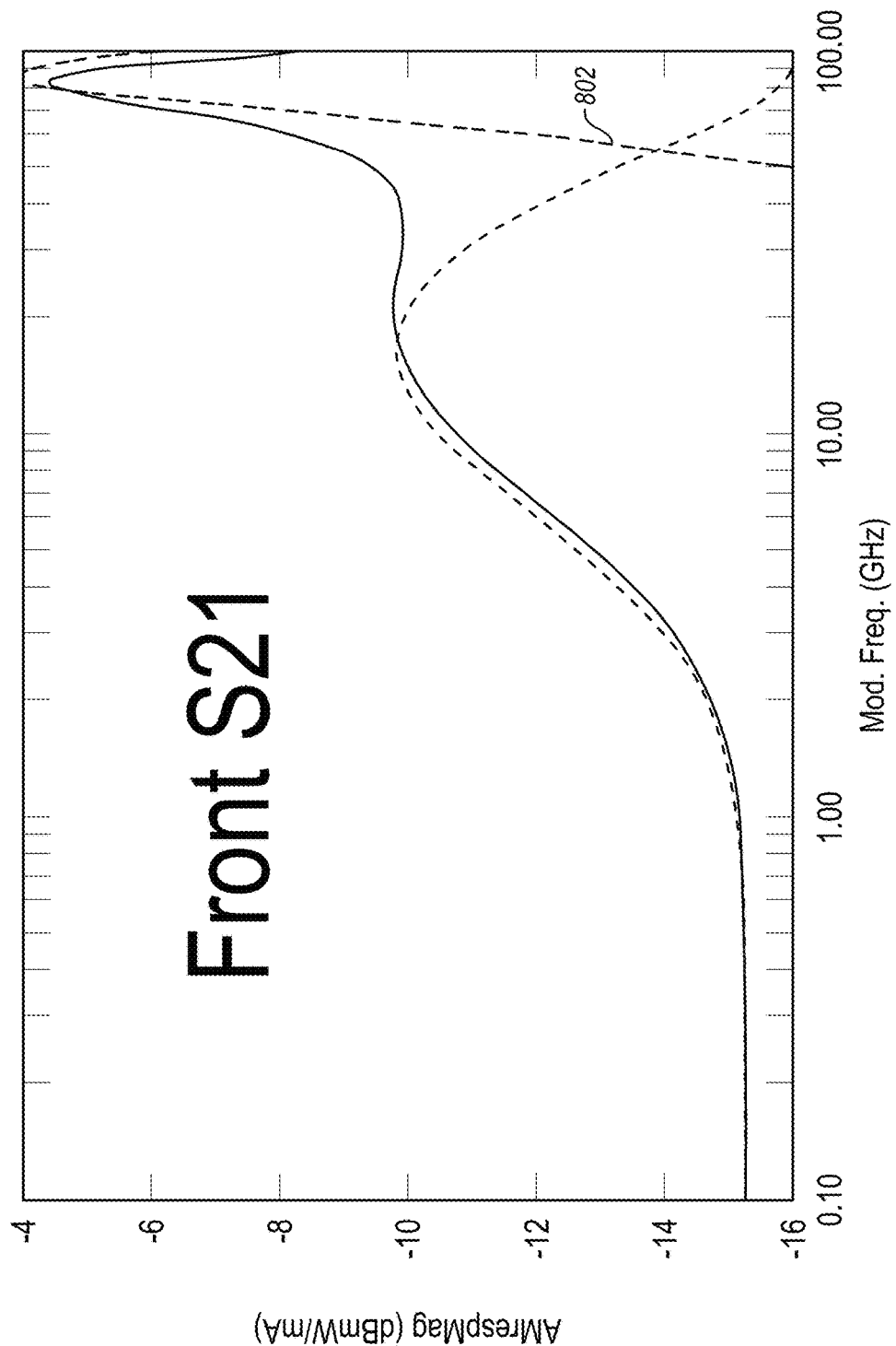
FIG. 8 illustrates a corresponding S21 response of a DR laser, such as the DR laser of FIG. 1 or 2.

FIG. 8 illustrates a corresponding S21 response of a DR laser, such as the DR laser 100 or 200 of FIG. 1 or 2, arranged in accordance with at least one embodiment described herein. The curve 802 that begins at about 50 GHz and −16 dBmW/mA has a peak at around 80 GHz that is created by the beating of DFB mode and external cavity mode formed by the DBR mirror. This enhances the S21 response around the beat frequency. This effect is called "p-p resonance effect". Embodiments of the DR laser described herein may have both the detuned-loading effect and the p-p resonance effect.

One problem that may be associated with some DR laser designs is the phase at the end of the HR coating formed on, e.g., the back side of the DFB region may change randomly. And the lasing position of the DFB region can move to anywhere within the DFB stop-band (e.g., the 8 nm stop-band of FIG. 3) depending on the grating phase at the facet.

Figure 9:
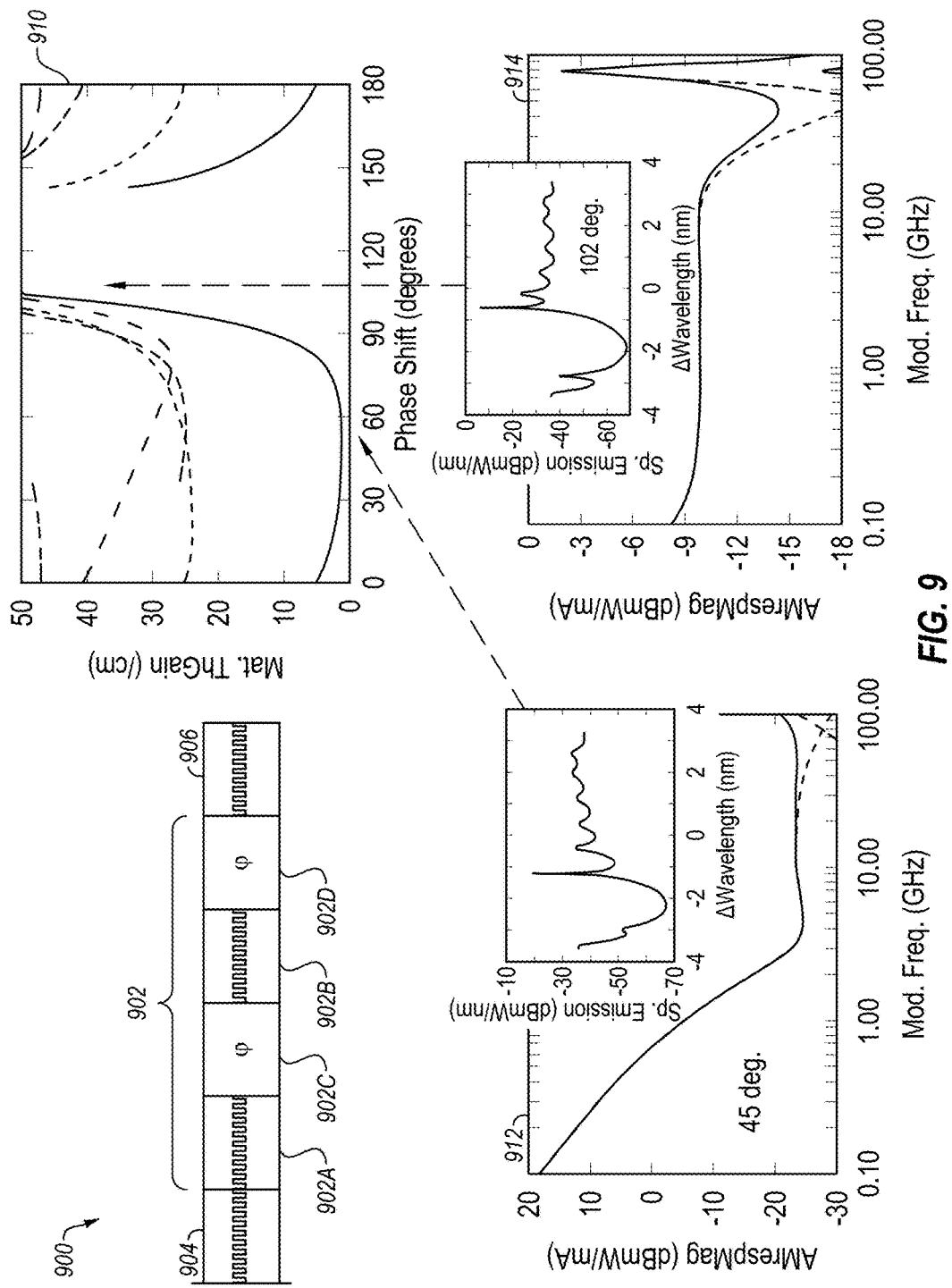
FIG. 9 illustrates an example DR laser with a DFB region sandwiched between two DBR regions.

Accordingly, in some embodiments, the HR coating (e.g., the HR coating 112 of FIG. 1) may be replaced with a DBR section with a very high kappa. An example is illustrated in FIG. 9, which illustrates an example DR laser 900 with a DFB region 902 sandwiched between two DBR regions 904, 906, arranged in accordance with at least some embodiments described herein. As illustrated, the DR laser 900 includes the DBR region 904 with a very high kappa instead of a HR coating. The DBR region 904 may be 100 µm in length with a kappa of 350 cm$^{-1}$ in an example embodiment. Various simulations 910, 912, and 914 associated with the DR laser 900 having various example parameters are also depicted in FIG. 9. The parameters used for the simulations 910, 921, and 914 include the following. The DBR region 904 may include a length of 100 µm, a Bragg wavelength of 1.3 µm, a kappa of 350 cm$^{-1}$, and a current of 0 mA. The DFB region 902 may include a first section 902A and a second section 902B, each with a length of 25 µm, a Bragg wavelength of 1.3 µm, a kappa of 120 cm$^{-1}$, and a current of 5 mA. The DFB region 902 may also include two phase shift sections 902C and 902D, the phase shift section 902C including a phase shift of 103 degrees and the phase shift section 902D including a phase shift of 0 degrees. The DBR region 906 may include a length of 200 µm, a Bragg wavelength of 1.298 µm, a kappa of 180 cm$^{-1}$, and a current of 0 mA.

When the lasing position (or lasing mode) sits at the edge of the DBR (e.g., the steep slope of the DBR reflection profile), FM modulation of directly modulated laser will be converted into AM modulation. This is very similar to operation of a "chirp-managed laser" (or CML) such as has been previously described in numerous patents and publications of the instant inventor, such as U.S. Pat. No. 7,542,683, which is incorporated herein by reference.

Figure 10:
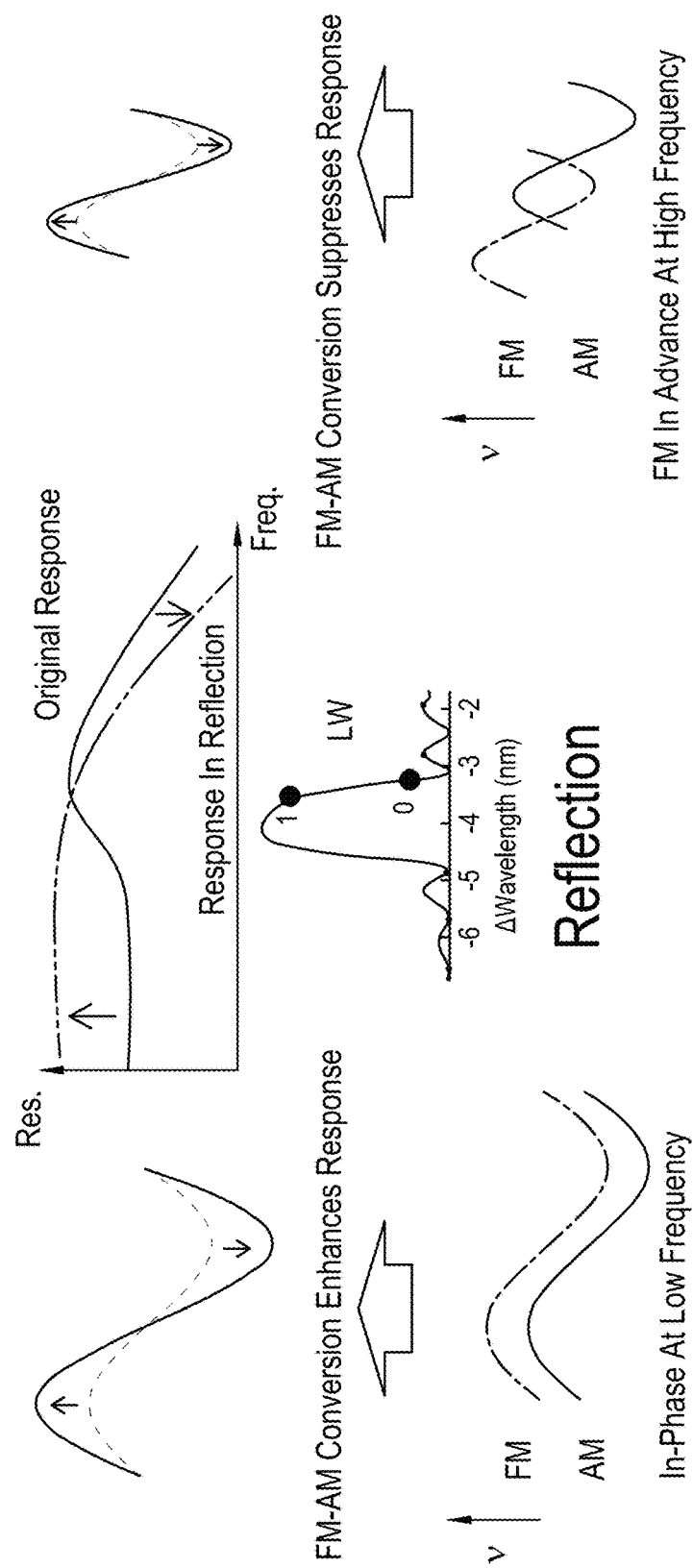
FIG. 10 depicts effects of FM-AM conversion at low and high frequency.

Referring to FIG. 10, transmission of DBR is usually used, but FM-AM conversion may reduce the modulation response at low frequency because AM and FM are in phase. However, at higher frequency, FM is in advance, and AM is delayed relatively. Then, FM-AM conversion may increase the modulation response. As a result, a DBR filter may create an effective "high pass" effect on S21 modulation response. Such an effect may be convenient to overcome the parasitic capacitance RC limitation of a laser chip that includes the DR laser. For instance, the laser chip may have 0.3 pF capacitance and 20 ohm resistance, so the RC cutoff is 26 GHz in this example. Some response enhancement effect due to FM-AM conversion, p-p resonance, and detuned loading effect (this reduces the damping of laser and creates S21 peaking) may help to overcome the RC limitation.

Figure 11:
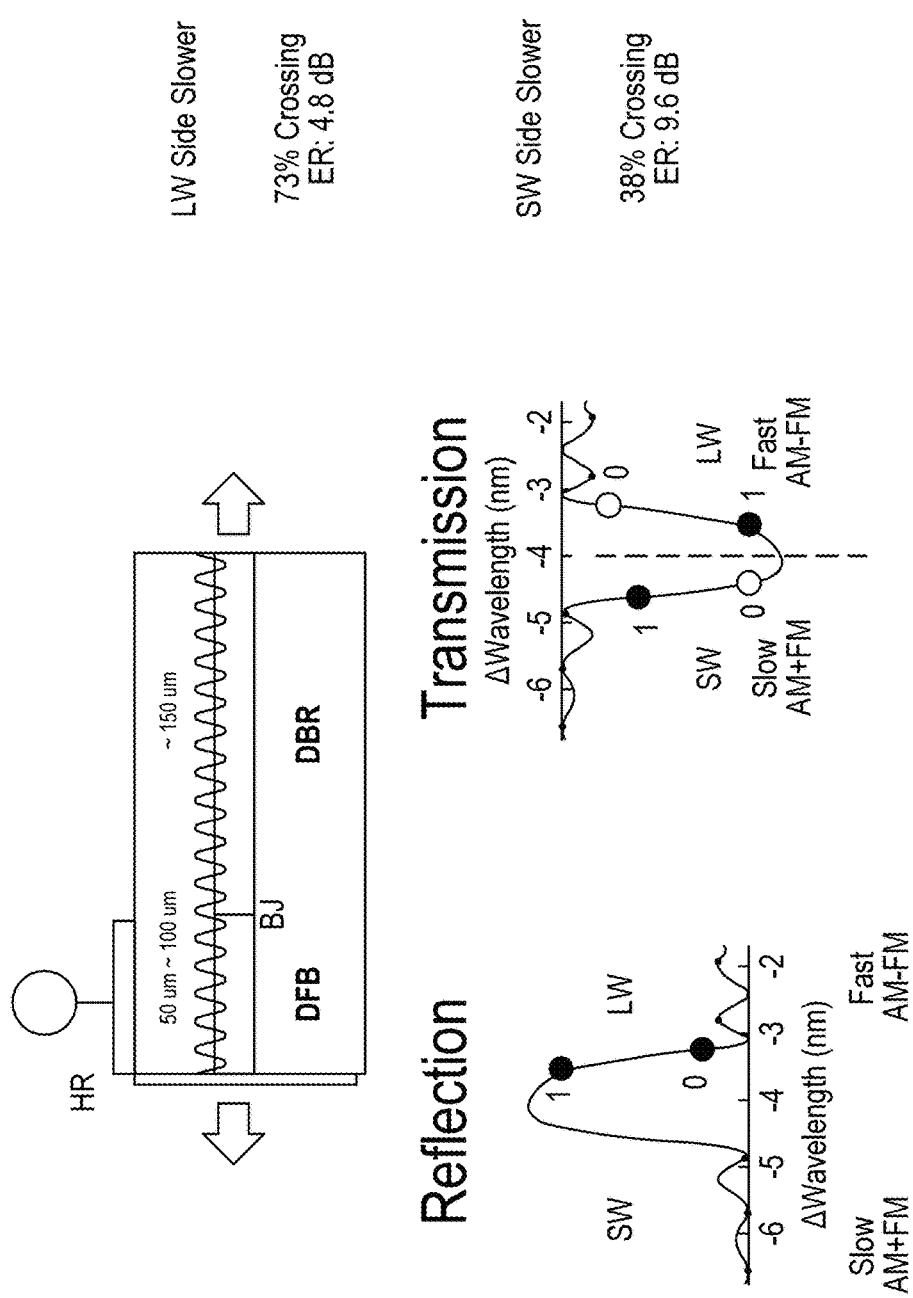
FIG. 11 depicts additional effects of FM-AM conversion.

Supporting evidence of this FM-AM conversion effect can be seen in FIG. 11, which depicts a 10 Gb/s NRZ experiment. When lasing happens on the long wavelength (LW) side of the DBR region, the laser speed gets faster (detuned loading), a crosspoint of eye diagram gets higher, and the extinction ratio (ER) gets lower. The opposite happens when lasing happens on the short wavelength (SW) side of the DBR region.

Figure 12:
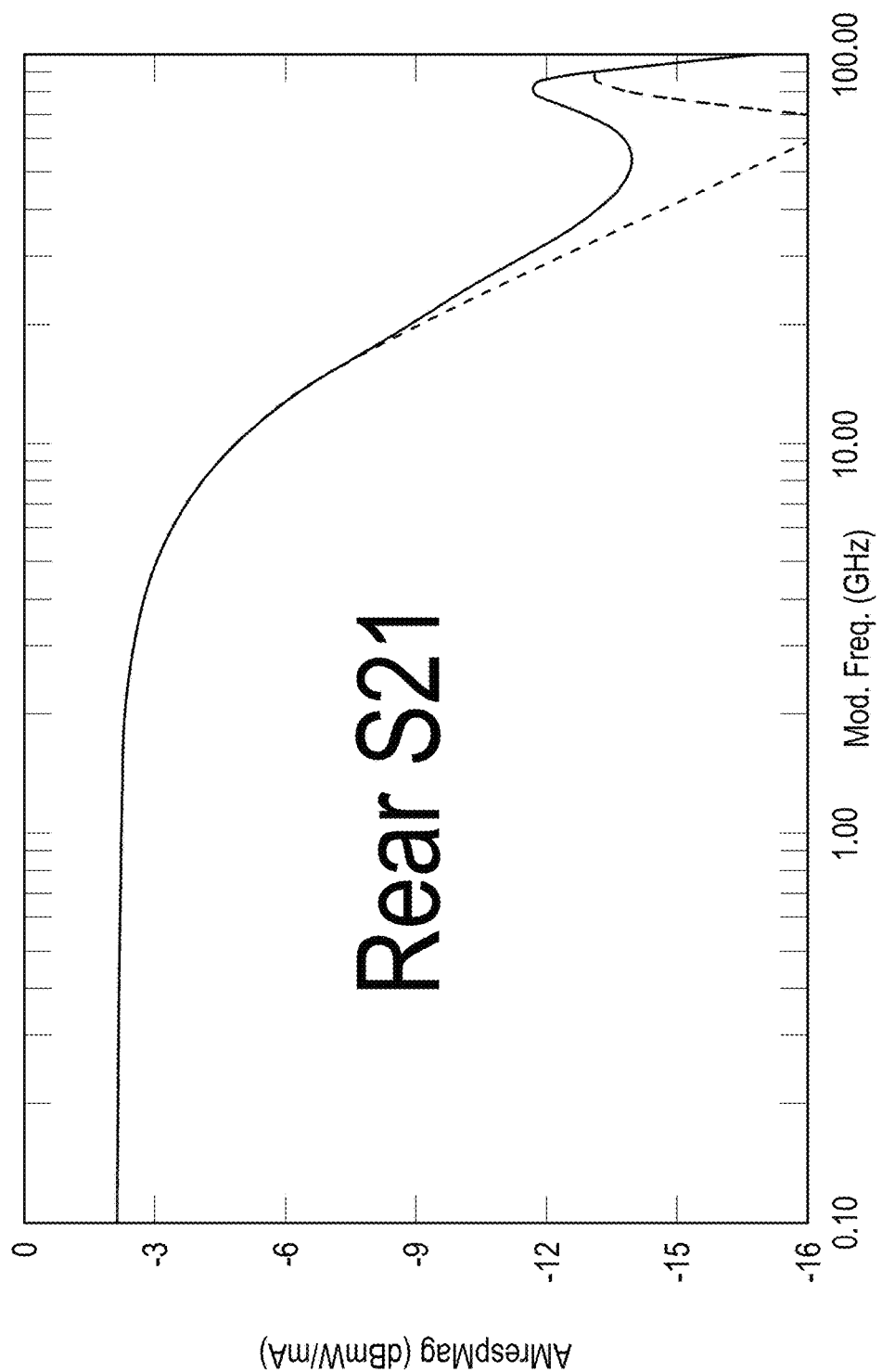
FIG. 12 depicts S21 response of a DR laser with reduced p-p resonance effect.

Accordingly, a lower ER may be a disadvantage for this side of output coupling. If the reflection side of the DBR region is used, the ER should be higher. However, in this case, the p-p resonance may not help to enhance the modulation BW, as can be seen from FIG. 12.

Figure 13:
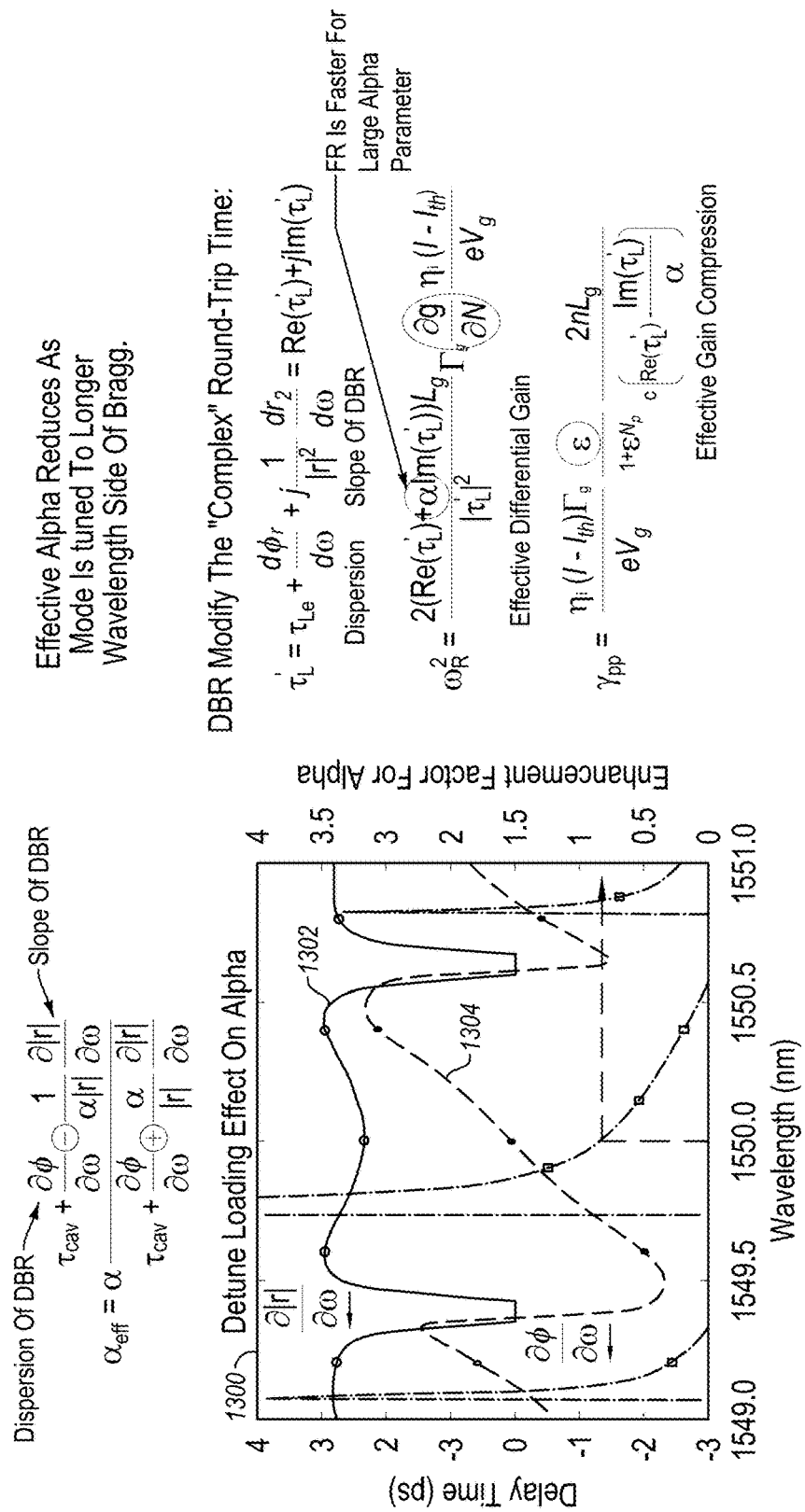
FIG. 13 depicts formulas and effects associated with an alpha parameter of a DR laser.

Referring to FIG. 13, based on the detuned-loading effect, the speed of laser can be enhanced by using larger alpha (a) parameter. FIG. 13 includes a graph 1300 that depicts, as a function of wavelength, delay time 1302, mirror slope (or slope of DBR) 1304, and detune loading alpha 1306. Differential gain is often maximized to enhance the speed.

Figure 14:
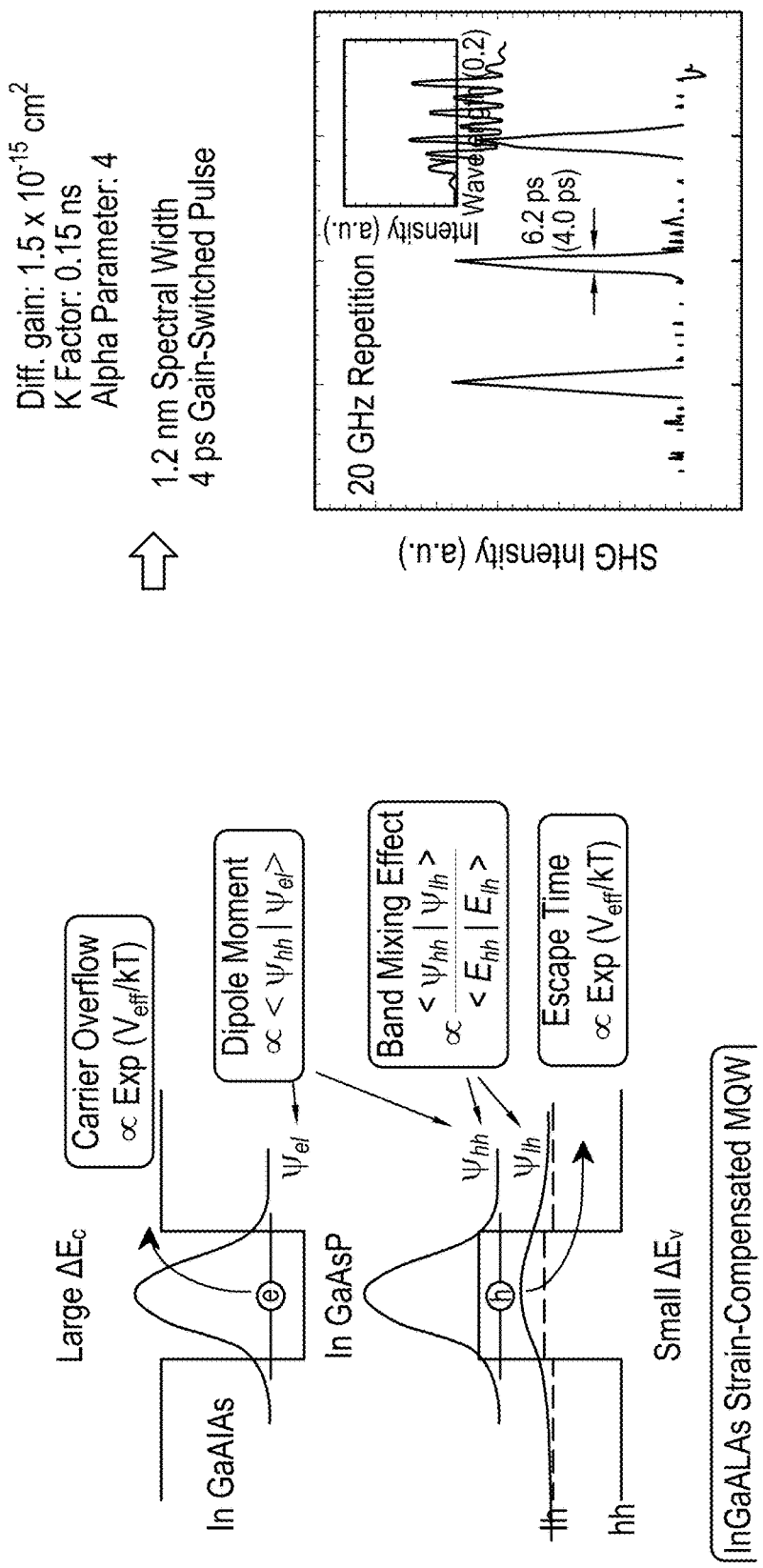
FIG. 14 illustrates a candidate for a high alpha parameter high differential gain DR laser design.

Referring to FIG. 14, a good candidate for this high alpha parameter-high differential gain design is provided. Reference is also made to Y. Matsui et al., "Enhanced Modulation Bandwidth for Strain-Compensated InGaAlAs—InGaAsP MQW Lasers," *IEEE Journal of Quantum Electronics*, vol. 34, No. 10, 1998, which is incorporated herein by reference.

Figure 15:
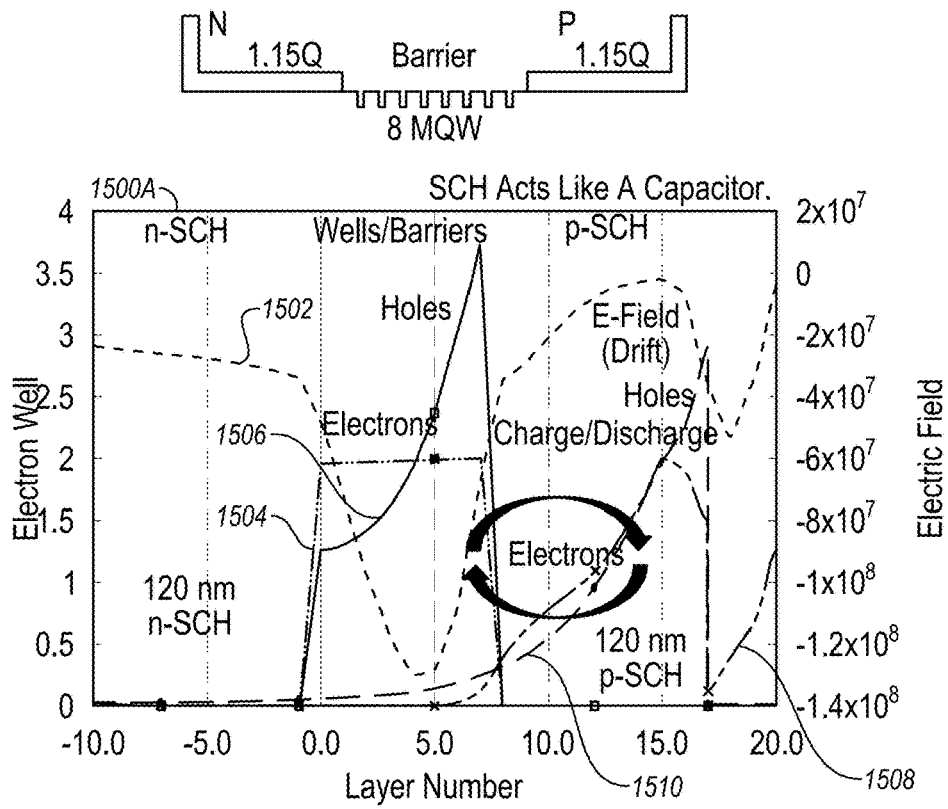
FIG. 15 illustrates other parameters that can be adjusted to achieve high alpha parameter DR laser design.
Figure 15:
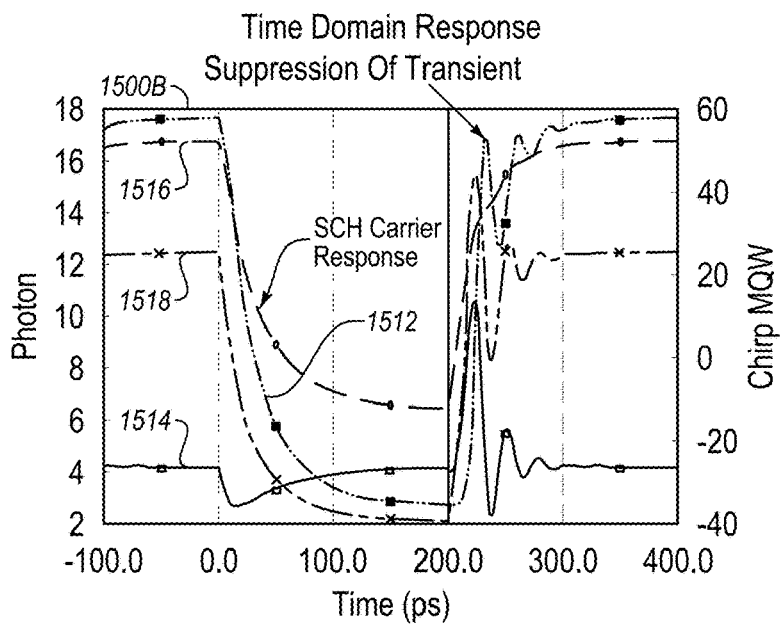

Referring to FIG. 15, other ideas for high alpha parameter are described in, e.g., U.S. Pat. No. 8,908,734, which is incorporated herein by reference. Carrier transport in the separate confinement heterostructure (SCH) can increase the alpha parameter without paying much penalty for differential gain. FIG. 15 depicts how carrier transport and dynamic change in intervalence band absorption (IVBA) can create a "loss mod effect". FIG. 15 includes a graph 1500A that depicts, as a function of layer number, e-field (drift) 1502, electrons 1504, holes 1506, electrons 1508, and holes 1510. FIG. 15 also includes a graph 1500B that depicts a time domain response for photons 1512, MQW chirp 1514, plasma chirp 1516, and total chirp 1518.

Figure 16:
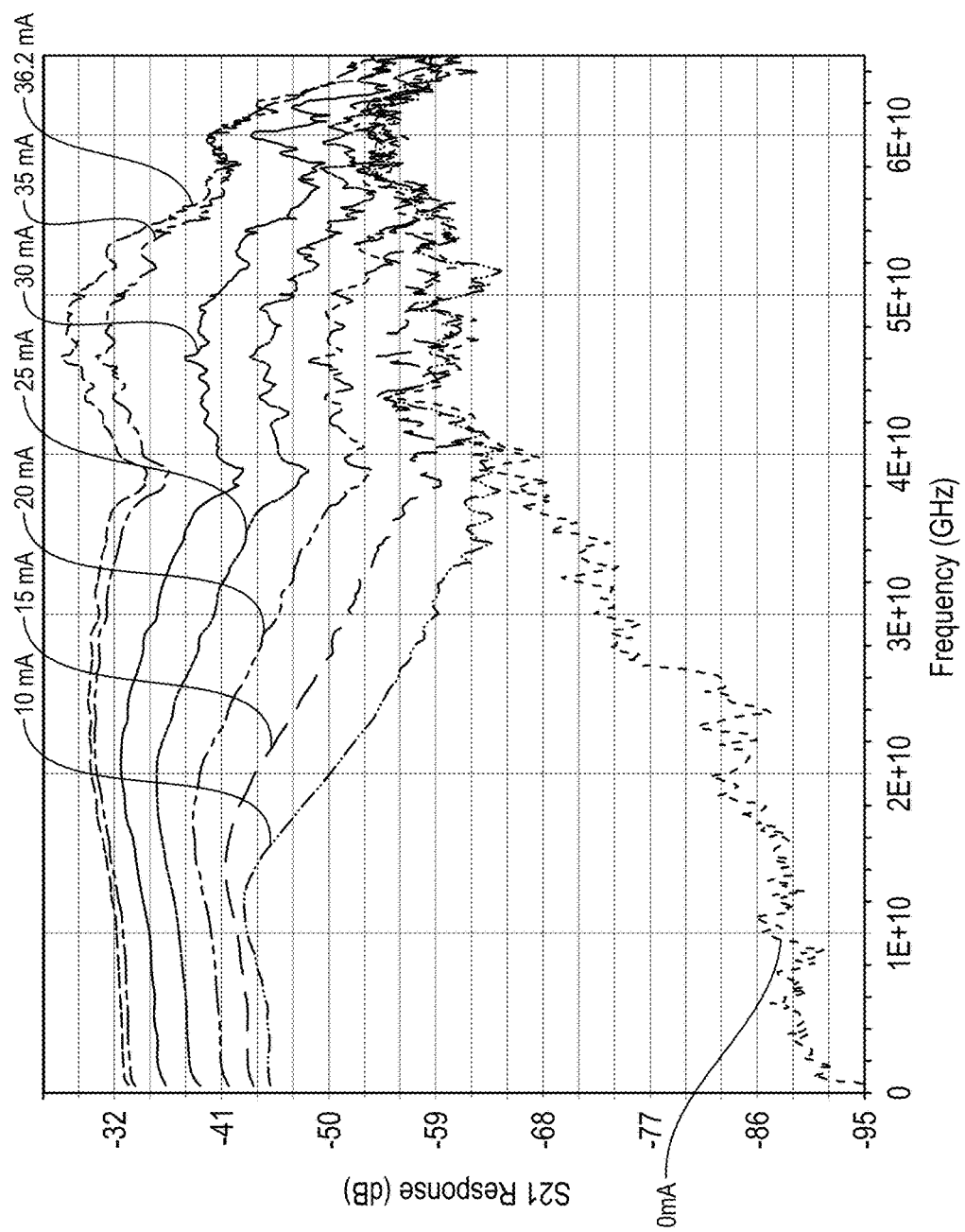
FIG. 16 shows an example S21 response of an example DR laser, such as the DR laser of FIG. 1 or 2.

FIG. 16 shows an example S21 response of an example DR laser, such as the DR laser 100 or 200 of FIG. 1 or 2, arranged in accordance with at least one embodiment described herein. The S21 response is depicted for various bias currents for the DFB region, including bias currents of 0 milliamps (mA), 10 mA, 15 mA, 20 mA, 25 mA, 30 mA, 35 mA, and 36.2 mA, as indicated in FIG. 16. In the example of FIG. 16, the peak around 10 GHz to 30 GHz is Fr, and it gets faster as the bias current is increased. The peak at about 58 GHz is a p-p resonance peak. The 3 dB BW is 55 GHz in this example.

Figure 17:
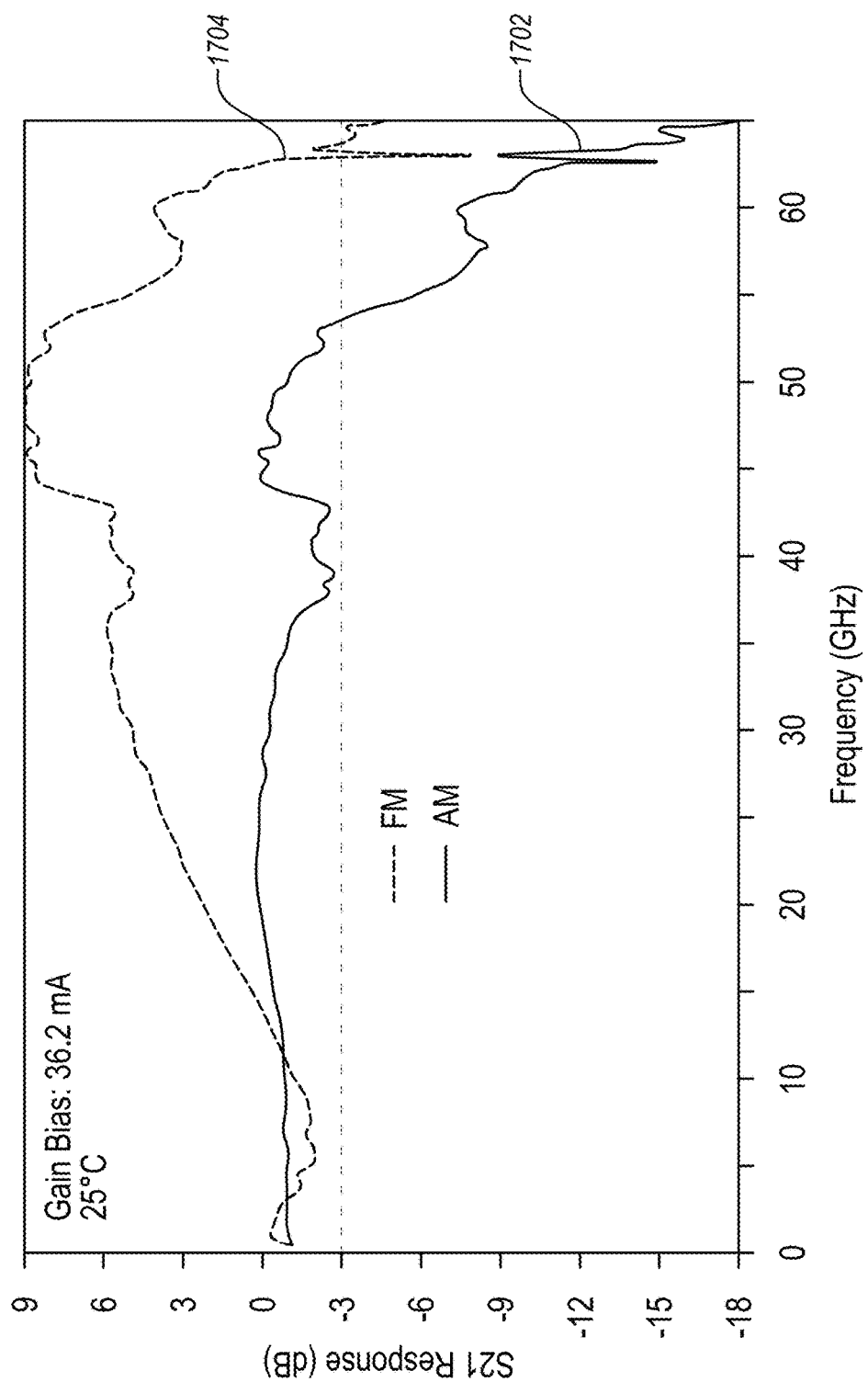
FIG. 17 illustrates AM and FM responses for an example DR laser, such as the DR laser of FIG. 1 or 2.

Referring to FIG. 17, AM and FM responses 1702 and 1704, respectively, were also measured for an example DR laser, such as the DR laser 100 or 200 of FIG. 1 or 2, arranged in accordance with at least one embodiment described herein. FM response BW is 65 GHz in this example.

Figure 18:
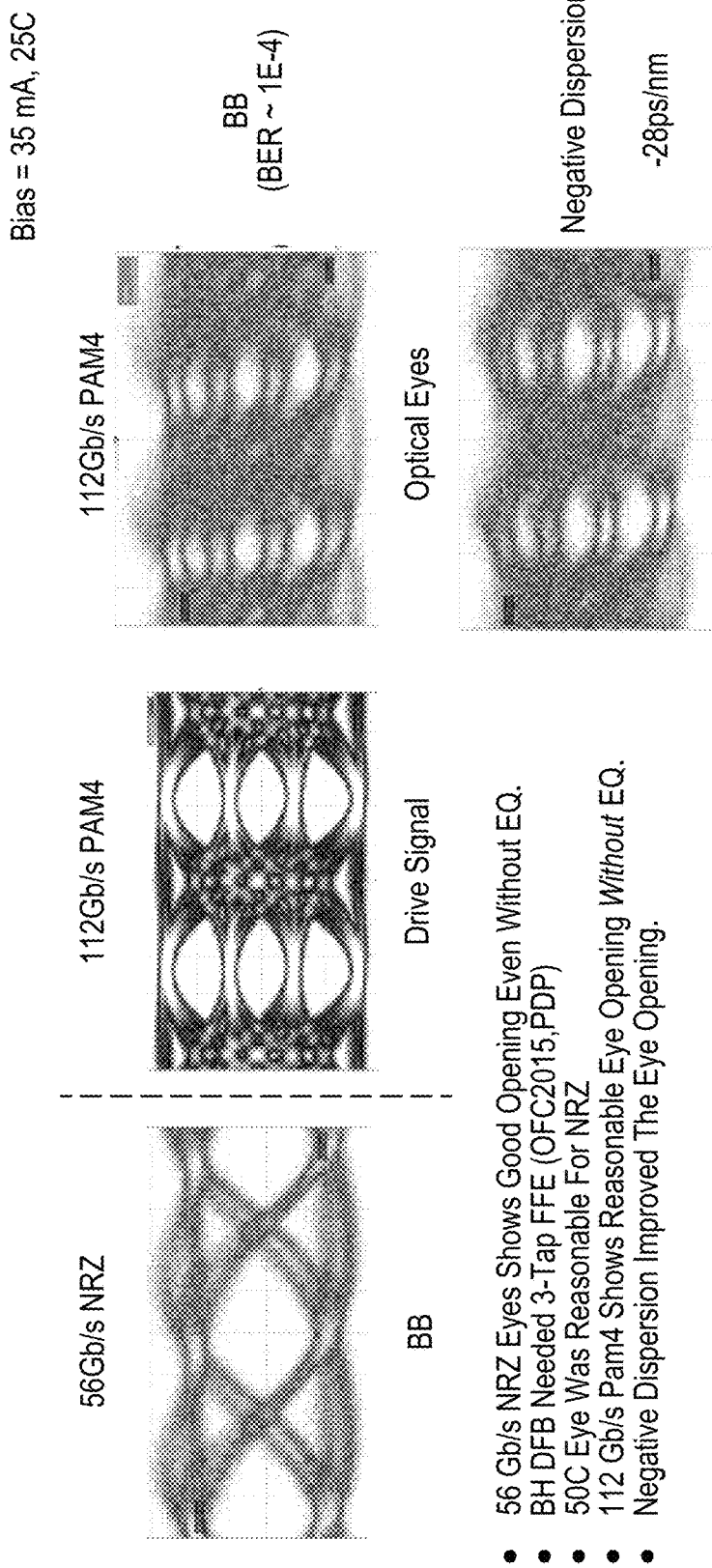
FIG. 18 illustrates an eye demonstrated for 56 Gb/s NRZ and 112 Gb/s PAM4 modulations for an example DR laser, such as the DR laser of FIG. 1 or 2.

FIG. 18 illustrates an eye demonstrated for 56 Gb/s NRZ and 112 Gb/s PAM4 modulations for an example DR laser, such as the DR laser 100 or 200 of FIG. 1 or 2, arranged in accordance with at least one embodiment described herein.

Embodiments of the DR laser described herein may be somewhat related to embodiments described in U.S. Pat. No. 9,048,618 (hereinafter the '618 patent), which is incorporated herein by reference. There are a number of differences between the embodiments described herein and the '618 patent.

In more detail, there are at least two approaches known to enhance the modulation speed of a laser beyond the intrinsic bandwidth. One is detuned-loading and the other is p-p resonance effect. In the '618 patent, focus was on the detuned-loading effect. The p-p resonance effect was not in the simulation model when cavity design was optimized in the '618 patent. The relevance of the p-p resonance has only recently been realized, the relevance of which is described in more detail with respect to FIGS. 19A and 19B.

Figure 19A:
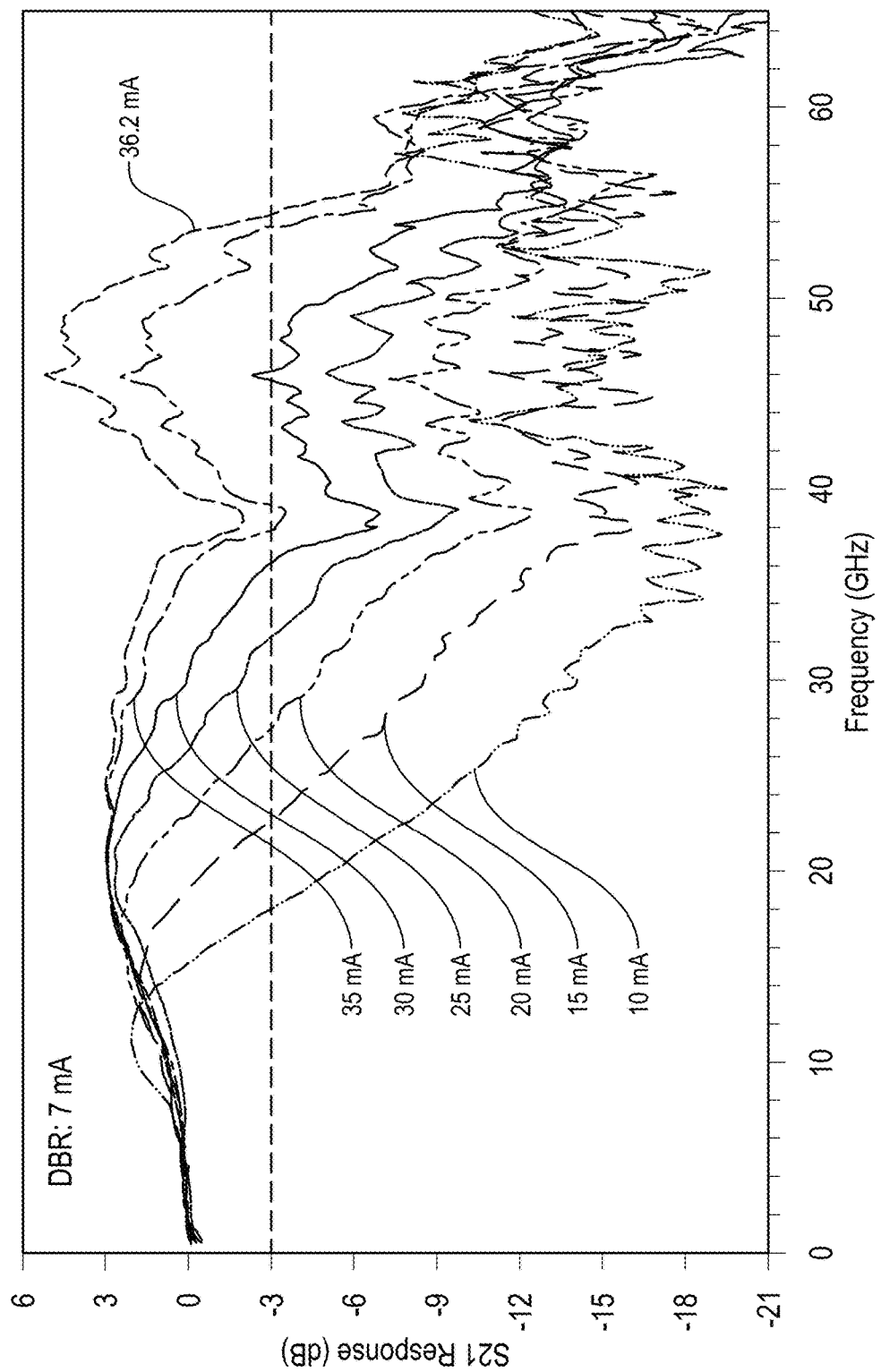
FIG. 19A shows an example S21 response of an example DR laser, such as the DR laser of FIG. 1 or, assuming a particular bias current for a DBR region of the DR laser.

FIG. 19A shows an example S21 response of an example DR laser, such as the DR laser 100 or 200 of FIG. 1 or 2, arranged in accordance with at least one embodiment described herein. The S21 response is depicted for various bias currents for the DFB region, and assuming a bias current of 7 mA for the DBR region. The various bias currents for the DFB region include bias currents of 10 mA, 15 mA, 20 mA, 25 mA, 30 mA, 35 mA, and 36.2 mA, as indicated.

The S21 peak in FIG. 19A at 50 GHz corresponds to the p-p resonance frequency created between the DFB and DBR modes. In order to achieve a flat S21 response, the resonance frequency (Fr) of the intrinsic laser response may be increased closer to the p-p resonance frequency. A common approach to enhance Fr is to increase the differential gain for the MQW gain material. However, the improvement in the material properties of MQW structures seems to be approaching to the maturity after decades of efforts. The other approach to enhance the differential gain is to utilize the detuned-loading effect using a gain material with a large linewidth enhancement factor. The enhancement factor ($\chi_r$) for Fr under detuned-loading effect can be written according to equations (1), (2), and (3):

$$F_r = \chi_r F_r^{FP} \tag{1}$$

$$\chi_r = \sqrt{L_a \text{Re}\left(\frac{1 + i\alpha_H}{L_a + \Lambda_{DBR}}\right)} \tag{2}$$

$$\Lambda_{DBR} = \frac{1}{2} i v_g \frac{\partial \ln R_{DBR}}{\partial \Omega}, \tag{3}$$

where $F_r^{FP}$ is the resonance frequency without the detuned-loading effect, $L_a$ is the length of the active region (e.g., of the DFB region), $\alpha_H$ is Henry's linewidth enhancement factor, $\Lambda_{DBR}$ is the complex value of an effective length of Bragg grating mirror for the DBR region, and $R_{DBR}$ is the complex amplitude reflectivity of the Bragg reflector (e.g., of the DBR region). The imaginary part of $\Lambda_{DBR}$ is a measure of the slope of the reflection spectrum (e.g., of the DBR region). Equations (1)-(3) show that the speed of the laser can be enhanced by using a steep slope on the DBR mirror (e.g., DBR region) and an MQW structure having a large linewidth enhancement factor $\alpha_H$.

In some embodiments described herein, values of 4 or larger for the linewidth enhancement factor $\alpha_H$ may be consider large. For instance, typical MQW structures may have a linewidth enhancement factor $\alpha_H$ between 2-4 such that anything greater than 4 may be "large".

For DML applications, it is often believed that smaller $\alpha_H$ should be realized to mitigate the dispersion penalty after fiber transmission. However, more accurately speaking, it is the transient chirp that causes a dispersion penalty while the adiabatic chirp component can even be useful in some cases. DML chirp can be modeled according to equation (4):

$$\Delta v(t) = \frac{\alpha_H}{4\pi} \left( \frac{d}{dt} [\text{Ln}(P(t))] + \kappa P(t) \right), \quad (4)$$

where P(t) is the intensity waveform and κ is the adiabatic chirp coefficient, which is in proportion to the gain compression factor. The first term on the right side of equation (4) describes the transient chirp and the second term is for the adiabatic chirp. The gain compression factor increases when there is any finite delay in the carrier injection process in the MQW, including the carrier transport in the SCH, and MQW with a large numbers of wells, as examples. The use of proper thickness of SCH can increase FM efficiency effectively and also properly damp the relaxation oscillation (or reduce the transient chirp) since thick SCH acts as a loaded capacitor that charges and discharges as the DML is modulated. At 1550 nm, 20-40 kilometer (km) transmission has been demonstrated at 10 Gb/s for a DBR laser using a thick SCH. See Y. Matsui, "Transceiver for NG-PON2: Wavelength bunability for burst mode TWDM and point-to-point WDM," OFC 2016, Paper Tu2C (Invited), 2016, which is incorporated herein by reference. The advantage of adiabatic chirp (or FM) has been also demonstrated earlier for extending the reach by the frequency shift keying-amplitude shift keying (FSK-ASK) format, and CML for 250 km transmission which creates a similar effect as an optical duo-binary format. See J. Binder, "10 Gbit/s dispersion optimized transmission at 1.55 mm wavelength on standard singe mode fiber," IEEE Photon Technol. Lett., vol 6, pp. 558-560, 1994; and Y. Matsui, "Chirp-managed directly modulated laser (CML)," IEEE Photon. Technol. Lett., vol. 18, pp 385-387, 2006, both of which are incorporated herein by reference.

Figure 19B:
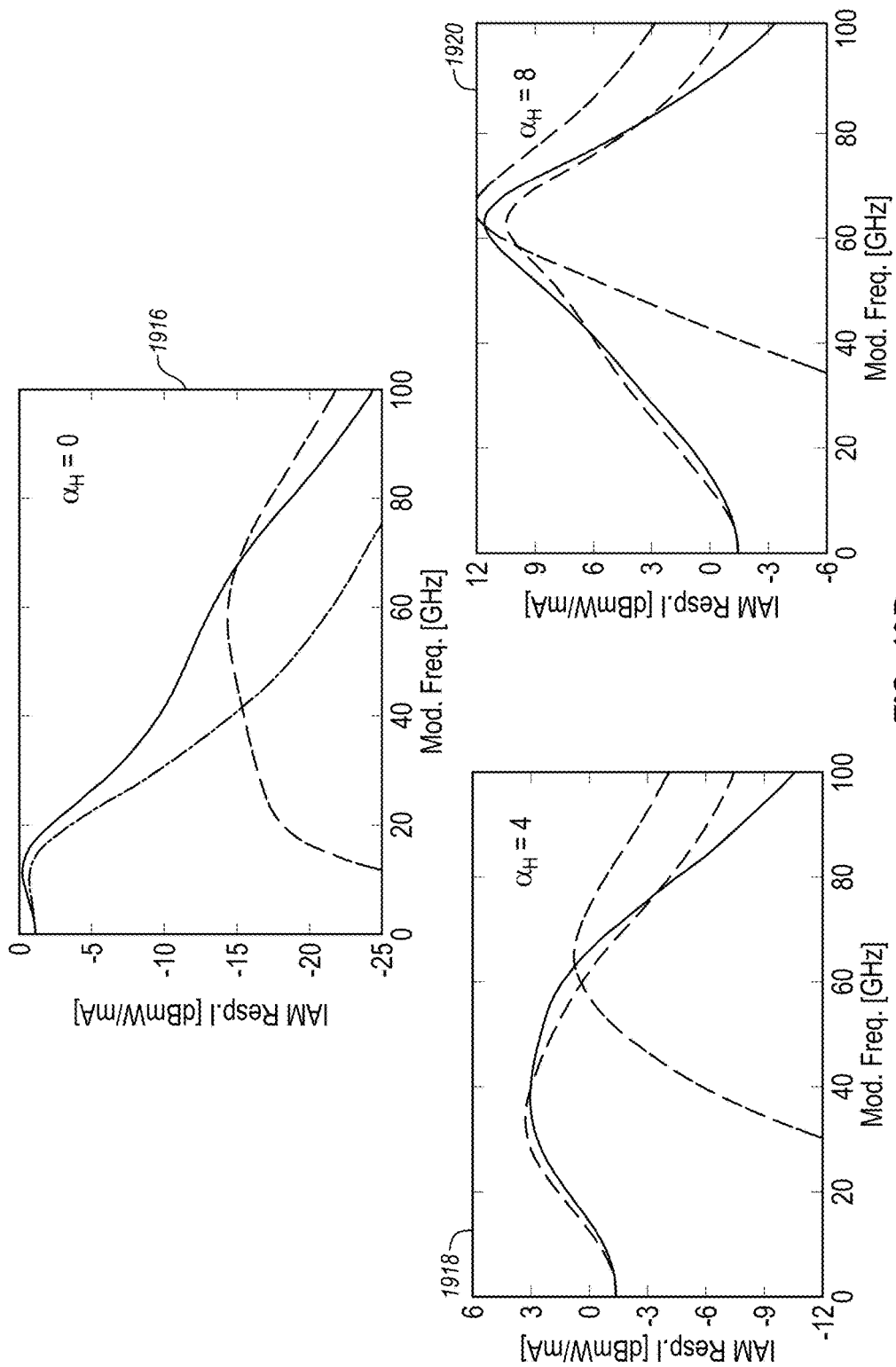
FIG. 19B shows example S21 responses for three different values of linewidth enhancement factor $\alpha_H$.

To demonstrate the relevance of large $\alpha_H$ for the speed enhancement of DMLs, LaserMatrix simulator was used to simulate in FIG. 19B S21 responses for the case of $\alpha_H$=0, 4, and 8, as indicated in, respectively, graphs 1916, 1918, and 1920. The p-p resonance peak locates at around 60 GHz for this cavity design (e.g., see DR laser 200 of FIG. 2). The peak at lower frequency in each of the graphs 1916, 1918, and 1920 is the resonance frequency, which moves out from about 15 GHz to about 38 GHz and then to about 60 GHz, as the alpha parameter $\alpha_H$ is increased. Accordingly, the combination of p-p resonance and detuned-loading effects can improve the BW of DR lasers as described herein to 50 GHz or higher.

Figure 20B:
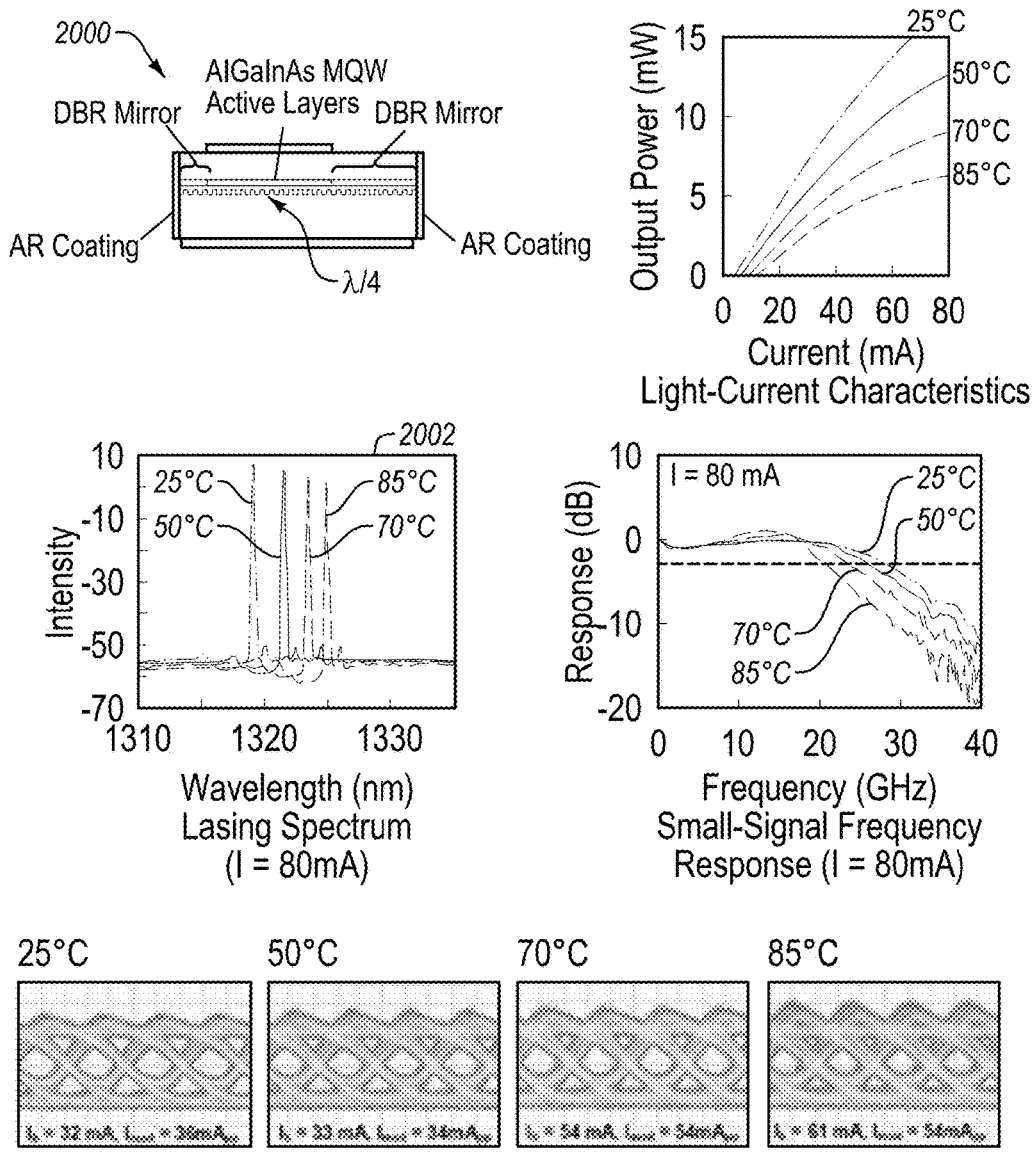

FIGS. 20A and 20B (hereinafter "FIG. 20") disclose a different DR laser 2000 design than the DR laser 100 or 200 of FIG. 1 or 2. The DR laser 2000 of FIG. 20 includes a 50 μm DBR region (labeled "DBR mirror" on the left of DR laser 2000 in FIG. 20) on a backside and a 100 μm DBR region (labeled "DBR mirror" on the right of DR laser 2000 in FIG. 20) on a front side of the DR laser 2000. FIG. 20 additionally illustrates a spectrum 2002 associated with the DR laser 2000. Each of the DBR regions in FIG. 20 is shorter than the DBR region in, e.g., FIG. 1 of the instant application. The difference in DBR length may be significant. In this structure of FIG. 20, it was claimed that the detuned-loading effect was not observed, nor the PPR effect. This is considered to be due to the short DBR length (100 um) and high grating strength (210 cm-1), which makes the DBR mirror profile broad and the penetration depth shallow, pushing the PPR frequency to >170 GHz. (International Semiconductor Laser Conference 2010, "Uncooled 40-Gbps Direct Modulation of 1.3-μm-Wavelength AlGaInAs Distributed Reflector Lasers with SI-BH", paper ThB3, 2010.

As illustrated in FIG. 20, the spectrum 2002 of the DR laser 2000 always show a spike at the bottom of main mode on the long wavelength side. It appears that this peak (or spike) resonates with the cavity and sideband, and can enhance the modulation speed of the DR laser 2000. But, because of relatively short DBR length for each of the DBR regions in the DR laser 2000, any p-p resonance for the DR laser 2000 may happen at about 170 GHz. That is too fast, and it does not help the S21 response.

Figure 21:
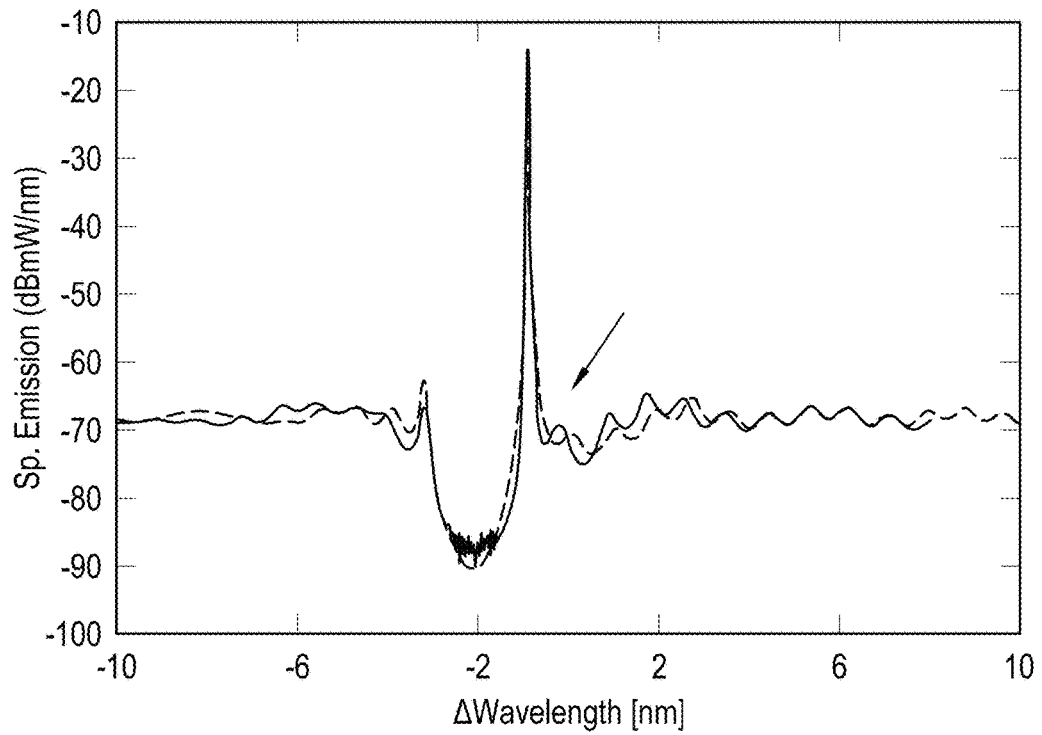
FIG. 21 illustrates a corresponding optical spectrum and example parameters of a DR laser, such as the DR laser of FIG. 1 or 2.
Figure 21:
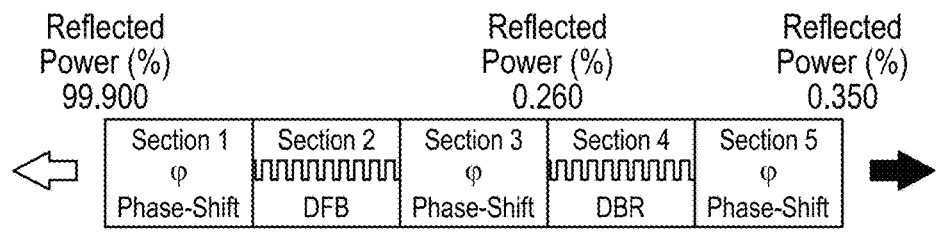

Referring to FIG. 21, embodiments of the DR lasers described herein may include a longer DBR (e.g., compared to the examples of FIGS. 20 and 21) as described elsewhere, which may result in a small mode just ~50 GHz away from the main peak, as described elsewhere. Accordingly, p-p resonance may happen at about 50 GHz, which may improve the S21 response.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A distributed reflector (DR) laser, comprising:
   a distributed feedback (DFB) region having a length in a range from 30 micrometers (μm) to 100 μm and comprising a DFB grating with a first kappa in a range from 100 cm$^{-1}$ to 180 cm$^{-1}$;
   a distributed Bragg reflector (DBR) region coupled end to end with the DFB region, having a length in a range from 30-300 μm and comprising a DBR grating with a second kappa in a range from 100 cm$^{-1}$ to 200 cm$^{-1}$;
   a lasing mode at a long wavelength side of a peak of a DBR reflection profile of the DBR region;
   a p-p resonance frequency in a range from 50-60 gigahertz (GHz); and
   an intrinsic resonant frequency (Fr) in a range from 15-38 GHz.

2. The DR laser of claim 1, wherein the length of the DFB region is 50 μm, the first kappa of the DFB grating is 120 cm$^{-1}$, the length of the DBR region is 200 μm, and the second kappa of the DBR grating is 180 cm$^{-1}$.

3. The DR laser of claim 1, wherein the DFB region has a first stop-band that is wider than a second stop-band of the DBR region.

4. The DR laser of claim 3, wherein the first stop-band of the DFB region is 8 nanometers (nm) in width and the second stop-band of the DBR region is 5 nm in width.

5. The DR laser of claim 1, wherein the DFB region further comprises a multiple quantum well (MQW) structure having a large linewidth enhancement factor ax.

6. The DR laser of claim 5, wherein the linewidth enhancement factor an of the MQW structure is greater than or equal to 4.

7. The DR laser of claim 6, wherein the linewidth enhancement factor an of the MQW structure is greater than or equal to 8.

8. The DR laser of claim 1, wherein the DFB region has a backside and a front side, the front side of the DFB region being coupled to the DBR region, the DR laser further comprising a high reflection (HR) coating formed on the backside of the DFB region.

9. The DR laser of claim 1, wherein the DR laser has a 3-decibel (dB) modulation bandwidth (BW) of at least 50 gigahertz (GHz).

10. A distributed reflector (DR) laser, comprising:
   a distributed feedback (DFB) region having a length in a range from 30 micrometers (μm) to 100 μm and comprising a DFB grating with a first kappa in a range from 100 cm$^{-1}$ to 150 cm$^{-1}$;
   a distributed Bragg reflector (DBR) region coupled end to end with the DFB region, having a length in a range from 30-300 μm and comprising a DBR grating with a second kappa in a range from 150 cm$^{-1}$ to 200 cm$^{-1}$;
   a lasing mode at a long wavelength side of a peak of a DBR reflection profile of the DBR region;
   an external cavity mode within 1 nanometer of the lasing mode;
   a p-p resonance frequency in a range from 50-60 gigahertz (GHz);
   an intrinsic resonant frequency (Fr) in a range from 30-35 GHz; and
   a 3-decibel (dB) modulation bandwidth (BW) of at least 50 gigahertz (GHz).

11. The DR laser of claim 10, wherein the length of the DFB region is 50 μm, the first kappa of the DFB grating is 120 cm$^{-1}$, the length of the DBR region is 200 μm, and the second kappa of the DBR grating is 180 cm$^{-1}$.

12. The DR laser of claim 10, wherein the DFB region has a first stop-band that is wider than a second stop-band of the DBR region.

13. The DR laser of claim 12, wherein the first stop-band of the DFB region is 8 nanometers (nm) in width and the second stop-band of the DBR region is 5 nm in width.

14. The DR laser of claim 10, wherein the external cavity mode is near a first null to the long wavelength side of the peak of the DBR reflection profile of the DBR region.

15. The DR laser of claim 10, wherein the external cavity mode is less than or equal to 70 gigahertz (GHz) from the lasing mode.

16. The DR laser of claim 10, wherein the DFB region further comprises a multiple quantum well (MQW) structure having a large linewidth enhancement factor an.

17. The DR laser of claim 16, wherein the linewidth enhancement factor an of the MQW structure is greater than or equal to 4.

18. The DR laser of claim 10, wherein the DFB region has a backside and a front side, the front side of the DFB region being coupled to the DBR region, the DR laser further comprising a high reflection (HR) coating formed on the backside of the DFB region.

19. A distributed reflector (DR) laser, comprising:
   a distributed feedback (DFB) region having a length in a range from 30 micrometers (μm) to 100 μm and comprising a DFB grating with a first kappa in a range from 100 cm$^{-1}$ to 180 cm$^{-1}$;
   a distributed Bragg reflector (DBR) region coupled end to end with the DFB region, having a length in a range from 30-300 μm and comprising a DBR grating with a second kappa in a range from 100 cm$^{-1}$ to 200 cm$^{-1}$;
   a lasing mode at a long wavelength side of a peak of a DBR reflection profile of the DBR region; wherein the lasing mode changes frequency toward the peak of the DBR reflection profile in response to a change in electrical current in the DFB region; and
   an external cavity mode within 1 nanometer of the lasing mode.

* * * * *